United States Patent
Shirao et al.

(10) Patent No.: US 11,703,378 B2
(45) Date of Patent: Jul. 18, 2023

(54) OPTICAL MODULE

(71) Applicant: Mitsubishi Electric Corporation, Tokyo (JP)

(72) Inventors: Mizuki Shirao, Tokyo (JP); Seiki Nakamura, Tokyo (JP); Kiyotomo Hasegawa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 89 days.

(21) Appl. No.: 17/515,766

(22) Filed: Nov. 1, 2021

(65) Prior Publication Data

US 2022/0057256 A1 Feb. 24, 2022

Related U.S. Application Data

(63) Continuation of application No. PCT/JP2019/021364, filed on May 29, 2019.

(51) Int. Cl.
*G01J 1/04* (2006.01)
*G01J 1/42* (2006.01)
*H05K 1/14* (2006.01)

(52) U.S. Cl.
CPC ............ *G01J 1/0403* (2013.01); *G01J 1/0411* (2013.01); *G01J 1/42* (2013.01); *H05K 1/147* (2013.01)

(58) Field of Classification Search
CPC ............. H01S 5/02218; H01S 5/02216; H01S 5/02212; H01S 5/02208; H01S 5/022;
(Continued)

(56) References Cited

U.S. PATENT DOCUMENTS 5,841,565 A * 11/1998 Kanai ................. H01L 31/0203
257/E31.118
7,073,958 B2 * 7/2006 Oomori ................ G02B 6/4201
385/92
(Continued)

FOREIGN PATENT DOCUMENTS

JP 2016-18862 A 2/2016
JP 2018-18887 A 2/2018

OTHER PUBLICATIONS

Nakaji et al., "Highly Reliable Wave-Guide Photodiode with Wide Bandwidth of 50 GHz at the Low Operation Voltage of -1.5 V," Optical Fiber Communications Conference, vol. 1, 2003, pp. 342-343.

*Primary Examiner* — John R Lee

(74) *Attorney, Agent, or Firm* — Birch, Stewart, Kolasch & Birch, LLP

(57) ABSTRACT

A metal stem includes a cylindrical portion in which an FPC inserting portion is formed, and a base standing upright from one plane of the cylindrical portion. A tubular lens cap with one open end is fixed to a peripheral portion of the one plane of the cylindrical portion, and has a lens mounted on a bottomed portion. A substrate mounted on one plane of the base includes a signal wiring layer and a ground wiring layer. An optical semiconductor element is mounted on the substrate and has a signal terminal connected to the signal wiring layer of the substrate, and a ground terminal connected to the ground wiring layer of the substrate. An FPC substrate is disposed so as to pass through the FPC inserting portion and to face the one plane of the base. The FPC substrate includes a signal wiring layer connected to the signal wiring layer of the substrate with a metal wire.

18 Claims, 8 Drawing Sheets

(58) Field of Classification Search
CPC .......... G02B 7/028; G02B 7/027; G02B 7/02;
G02B 7/003; G02B 7/00; H05B 10/60;
H04B 10/40; H04B 10/503; H04B
10/502; H04B 10/501; H04B 10/50;
H05K 1/14; H05K 1/141; H05K 1/142;
H05K 1/148; H05K 1/147; G01J 1/42;
G01J 1/04; G01J 1/0403; G01J 1/0407;
G01J 1/0411

See application file for complete search history.

(56) References Cited

U.S. PATENT DOCUMENTS

| | | | |
|---|---|---|---|
| 7,215,886 B2* | 5/2007 | Maruyama | H01S 5/02212 |
| | | | 398/117 |
| 10,534,239 B2* | 1/2020 | Tanaka | G02F 1/2257 |
| 11,307,376 B2* | 4/2022 | Mochizuki | G02B 7/025 |
| 2006/0164817 A1* | 7/2006 | Yoshida | H01L 31/02325 |
| | | | 257/E31.127 |
| 2007/0023766 A1* | 2/2007 | Aruga | H01S 5/02212 |
| | | | 257/98 |
| 2015/0116809 A1* | 4/2015 | Uto | H01S 5/02208 |
| | | | 359/245 |
| 2016/0006210 A1 | 1/2016 | Noguchi et al. | |
| 2018/0031779 A1 | 2/2018 | Kimura | |
| 2020/0400913 A1* | 12/2020 | Mochizuki | H04B 10/50 |
| 2021/0013694 A1* | 1/2021 | Masuyama | H01S 5/02415 |
| 2022/0057256 A1* | 2/2022 | Shirao | H01L 31/02325 |

\* cited by examiner

OPTICAL MODULE

CROSS REFERENCE TO RELATED APPLICATION

This application is a Continuation of PCT International Application No. PCT/JP2019/021364, filed on May 29, 2019, which is hereby expressly incorporated by reference into the present application.

TECHNICAL FIELD

The present invention relates to an optical module, and for example, relates to an optical transmission module on which a semiconductor laser for optical communication which is a light emitting element is mounted, an optical reception module on which a photodiode for optical communication which is a light receiving element is mounted, and an optical transmission and reception module on which a semiconductor laser for optical communication and a photodiode for optical communication are mounted.

BACKGROUND ART

Patent Literature 1 is known as an optical module for optical communication.

In particular, in Patent Literature 1, the following optical module is illustrated in FIG. 14 and a description related thereto. That is, a semiconductor laser is fixed to a base fixed to a surface of a stem. A lead terminal for transmitting a modulated electric signal passes through the stem, is held in a through hole by sealing glass, and is inside connected, via a wire, to metallized wiring formed on a surface of a heat dissipation substrate attached to the base. A lead terminal for supplying power passes through the stem, is held in a through hole by a glass material, and is inside connected to a photodiode or the like that monitors an output of the semiconductor laser. A ground pin is welded to the stem.

An entire flexible wiring substrate (FPC) is disposed outside the stem, and a ground line connected to the stem is formed. Although not clearly described, the flexible wiring substrate is connected, outside the stem, to the lead terminal for transmitting a modulated electric signal and the lead terminal for supplying power with solder.

CITATION LIST

Patent Literature

Patent Literature 1: JP 2016-18862 A

SUMMARY OF INVENTION

Technical Problem

In the optical module disclosed in Patent Literature 1, since the modulated electric signal and the power supplied to the semiconductor laser are transmitted by the lead terminals passing through the stem, when the lead terminals are too thin, the lead terminals are easily bent during manufacturing, and thus it is difficult to make electrical contact during a test.

In addition, the dielectric constant of the sealing glass which influences an impedance, and a difference in thermal linear expansion coefficient between the lead terminal and the sealing glass need to be appropriate, and thus the degree of freedom in design is low.

In order to obtain a general impedance of 50Ω, the diameter of the lead terminal is 0.2 mm in a case where the sealing glass has a glass relative dielectric constant of 6.0 and the stem serving as an outer conductor of a coaxial structure has a hole diameter of 1.2 mm, and thus there is a problem that the lead terminal is easily bent and is poor in mass productivity.

Furthermore, there is also a problem that a portion of the lead terminal present inside the stem degrades high frequency characteristics by serving as an inductance component.

The present invention has been made in view of the above problems, and an object of the present invention is to obtain an optical module that simplifies a structure of a metal stem to make impedance management easy, and has excellent high frequency characteristics.

Solution to Problem

An optical module according to the present invention includes:

a metal stem including a cylindrical portion in which an FPC inserting portion is formed, and a base standing upright from one plane of the cylindrical portion;

a tubular lens cap with one open end, the tubular lens cap covering the base of the metal stem, having an open end surface fixed in contact with a peripheral portion of the one plane of the cylindrical portion of the metal stem, and having a lens mounted on a bottomed portion of the tubular lens cap;

a ceramic substrate mounted on one plane of the base of the metal stem, and including a signal wiring layer and a ground wiring layer formed on a first main surface of the ceramic substrate;

an optical semiconductor element mounted on the first main surface of the ceramic substrate, having a signal terminal electrically connected to the signal wiring layer of the ceramic substrate and a ground terminal electrically connected to the ground wiring layer of the ceramic substrate, and including a light emitting element for emitting light in a direction toward a lens; and a flexible printed circuit having a first end passing through the FPC inserting portion of the cylindrical portion of the metal stem and facing the one plane of the base of the metal stem, having a second end located outside the metal stem, and including a signal wiring layer formed on a first main surface of the flexible printed circuit so as to extend from the first end to the second end, and electrically connected to the signal wiring layer of the ceramic substrate with a metal wire at the first end.

Advantageous Effects of Invention

The present invention simplifies a structure of a metal stem to make impedance management easy, and has excellent high frequency characteristics.

DESCRIPTION OF EMBODIMENTS

Figure 1:
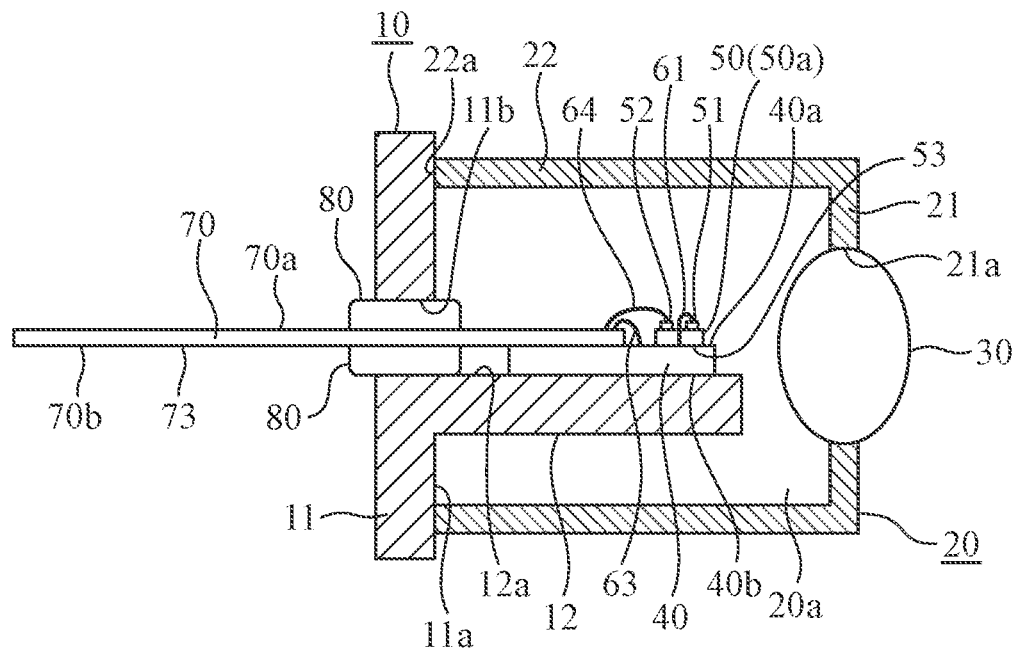
FIG. 1 is a front view illustrating a cross section of a metal stem 10 and a lens cap 20, indicating an optical module according to a first embodiment of the present invention.

Hereinafter, in order to describe the present invention in more detail, embodiments for performing the present invention will be described with reference to the attached drawings.

First Embodiment

As for an optical module according to a first embodiment of the present invention, an optical transmission module on which a semiconductor laser for optical communication which is a light emitting element is mounted, that is, a semiconductor laser module will be described with reference to FIGS. 1 to 3. The semiconductor laser module has a configuration in which a semiconductor laser for optical communication is mounted on a TO-CAN package.

A metal stem 10 includes a cylindrical portion 11 made of a disk-shaped metal, and a flat plate-shaped base 12 vertically standing upright from one plane 11a of the cylindrical portion 11. An FPC inserting portion 11b is formed in a central portion of the cylindrical portion 11. The FPC inserting portion 11b is a through hole having a rectangular opening surface. One plane 12a of the base 12 is on the same plane as an open end surface of the FPC inserting portion 11b located on a lower side in the drawing.

In the first embodiment, the cylindrical portion 11 and the base 12 are integrally formed, but may be obtained by constituting the cylindrical portion 11 and the base 12 separately, and fixing and integrating the cylindrical portion 11 and the base 12 to each other with solder or the like.

A lens cap 20 is made of a cylindrical metal having one open end, a bottomed portion 21 and a side wall portion 22. In the bottomed portion 21 of the lens cap 20, a lens installing opening 21a in which a lens 30 is mounted, that is, installed is formed. The lens 30 is installed in the lens installing opening 21a of the bottomed portion 21 in such a manner that airtightness is maintained inside and outside the lens cap 20.

An end surface of the side wall portion 22 of the lens cap 20, that is, an open end surface 22a is fixed in contact with a peripheral end of the one plane 11a of the cylindrical portion 11 of the metal stem 10 with solder or the like. As a result, the base 12 of the metal stem 10 is disposed in a hollow portion 20a of the lens cap 20, and the lens cap 20 covers the base 12. Also, on the open end surface 22a, the open end surface 22a of the lens cap 20 is fixed to the one plane 11a of the cylindrical portion 11 of the metal stem 10 in such a manner that airtightness is maintained inside and outside the lens cap 20. The fixation and installation are performed at an end of a manufacturing process.

A ceramic substrate 40 is mounted, that is, installed in the one plane 12a of the base 12 of the metal stem 10. As for a material of the ceramic substrate 40, aluminum nitride having a thermal linear expansion coefficient close to that of a semiconductor laser constituting an optical semiconductor element 50 is used. The ceramic substrate 40 has a thickness of 200 um in such a manner that stress due to thermal expansion of the ceramic substrate 40 and the base 12 of the metal stem 10 is not transmitted to the semiconductor laser. Note that the thickness of the ceramic substrate 40 only needs to be equal to or more than 200 um and equal to or less than 300 um.

On a first main surface 40a of the ceramic substrate 40 at an end of the lens cap 20 on the bottomed portion 21 side, a ceramic substrate signal wiring layer 41 (hereinafter, referred to as a signal wiring layer 41 for simplicity) for transmitting a high frequency signal, a ceramic substrate ground wiring layer 42 (hereinafter, referred to as a ground wiring layer 42 for simplicity) through which a return current flows, a 50Ω termination resistor 43 for matching impedance with an IC for driving a semiconductor laser constituting the optical semiconductor element 50, and a resistance connection wiring layer 44 are arranged by vapor deposition or the like. The IC for driving a semiconductor laser is an electro-absorption (EA) modulator in the first embodiment.

Figure 3:
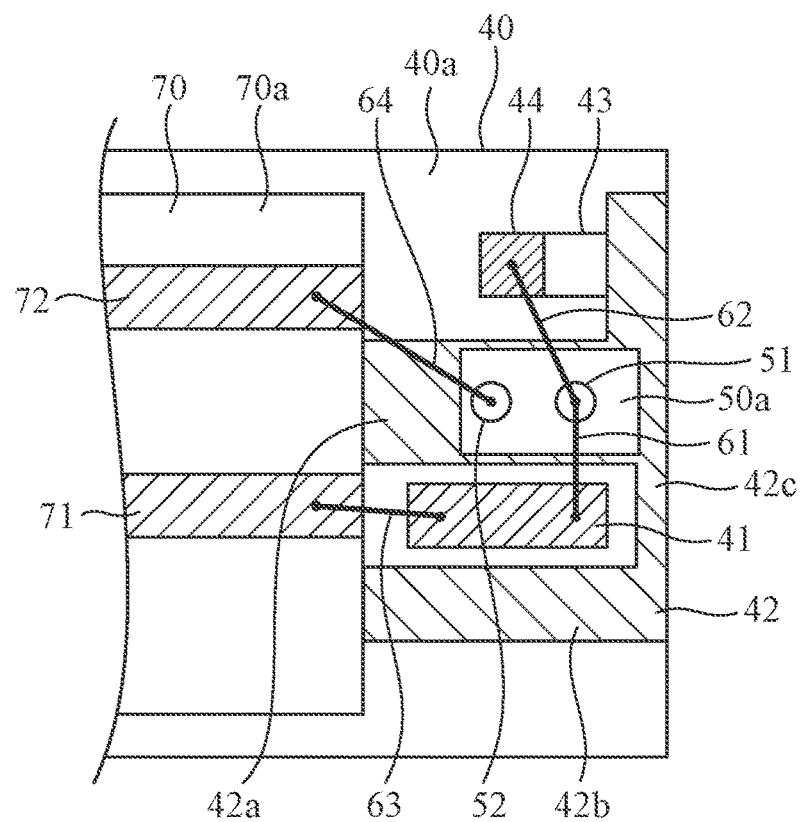
FIG. 3 is an enlarged plan view of a main part, indicating the optical module according to the first embodiment of the present invention.

As illustrated in FIG. 3, in the ground wiring layer 42, on the first main surface 40a of the ceramic substrate 40, a center line 42a extending in a longitudinal direction which is a direction from the bottomed portion 21 toward the cylindrical portion 11, a peripheral line 42b located in parallel with the center line 42a at an interval, and an end line 42c extending from an end of the peripheral line 42b to a side opposite to the peripheral line 42b via the center line 42a at an end of the ceramic substrate 40 on the bottomed portion 21 side (hereinafter, referred to as a first end) are formed. The center line 42a and the peripheral line 42b may extend to a second end opposite to the first end of the ceramic substrate 40.

As illustrated in FIG. 3, the signal wiring layer 41 is formed between the center line 42a and the peripheral line 42b at the first end of the first main surface 40a of the ceramic substrate 40 so as to be insulated from the center line 42a and the peripheral line 42b.

As illustrated in FIG. 3, the resistance connection wiring layer 44 is formed at the first end of the first main surface 40a of the ceramic substrate 40 at a position facing an extending end of the end line 42c so as to be insulated from the center line 42a.

As illustrated in FIG. 3, a first end of the termination resistor 43 is connected to the resistance connection wiring layer 44, and a second end thereof is connected to the extending end of the end line 42c of the ground wiring layer 42.

A second main surface 40b of the ceramic substrate 40 is fixed in contact with the one plane 12a of the base 12 of the metal stem 10. As a result, the base 12 of the metal stem 10 functions as a heat dissipation body with respect to the ceramic substrate 40. That is, heat generated by the optical semiconductor element 50 and the termination resistor 43 is transmitted from the base 12 of the metal stem 10 to the cylindrical portion 11 via the ceramic substrate 40, and is dissipated to the outside.

The optical semiconductor element 50 (hereinafter, referred to as a light emitting element 50a) that is a semiconductor laser is mounted on the first main surface 40a of the ceramic substrate 40. As for the semiconductor laser, an electro-absorption modulator integrated with DFB laser (EML) is used. The electro-absorption modulator integrated with DFB laser includes an electro-absorption modulator and a distributed feedback Bragg-reflector (DFB) laser. In addition, in the first embodiment, a photodiode for receiving back light of the distributed feedback Bragg-reflector laser and monitoring output light is mounted and integrated inside the electro-absorption modulator integrated with DFB laser. The photodiode does not have to be integrated as long as monitoring is not required.

In the light emitting element 50a, a signal terminal 51 which is an EA modulator pad and a power supply terminal 52 which is a DFB laser pad are arranged on an upper surface, and a ground terminal 53 formed by a ground layer is disposed on a lower surface.

The light emitting element 50a emits light that is laser light in a direction toward the lens 30, and the light is condensed or converted into parallel light via the lens 30 and emitted to the outside.

That is, the direction of light emitted from the light emitting element 50a is a horizontal direction with respect to the one plane 12a of the base 12 of the metal stem 10, that is, with respect to a mounting surface. Therefore, the structure is suitable for an end surface emission type semiconductor laser in which light is emitted in the horizontal direction.

The signal terminal 51 is a pad electrically connected to the electro-absorption modulator inside and exposed to the outside, is electrically connected to the signal wiring layer 41 of the ceramic substrate 40 with a metal wire 61 made of gold by wire bonding, and is electrically connected to the resistance connection wiring layer 44 of the ceramic substrate 40 with a metal wire 62 made of gold by wire bonding.

The power supply terminal 52 is a pad supplied with various power supplies, in this example, a DC power supply, electrically connected to a distributed feedback Bragg-reflector laser or the like inside, and exposed to the outside.

The ground terminal 53 is a ground layer electrically connected in contact with the center line 42a of the ground wiring layer 42 of the ceramic substrate 40. The ground terminal 53 is electrically and mechanically connected directly to the center line 42a of the ground wiring layer 42 of the ceramic substrate 40 with solder, a conductive adhesive, or the like.

The flexible printed circuit (FPC) 70 is disposed in such a manner that a first end thereof passes through the FPC inserting portion 11b of the cylindrical portion 11 of the metal stem 10 and faces the one plane 12a of the base 12 of the metal stem 10, and a second end thereof is located outside the cylindrical portion 11. The flexible printed circuit 70 is sealed with a sealing material 80 in the FPC inserting portion 11b of the cylindrical portion 11. The sealing material 80 is a glass material, and can airtightly seal a space between the flexible printed circuit 70 and the cylindrical portion 11 of the metal stem 10.

A part of the first end of the flexible printed circuit 70 overlaps with a part of the ceramic substrate 40, that is, with a side opposite to the bottomed portion 21, and is fixed. The ceramic substrate 40 is sandwiched between a part of the first end of the flexible printed circuit 70 and the base 12 of the metal stem 10. In addition, the flexible printed circuit 70 is fixed at two points of the cylindrical portion 11 and the base 12 of the metal stem 10.

Note that, in an optical module used in a managed environment such as a data center, the flexible printed circuit 70 does not have to be sealed with the sealing material 80 in the FPC inserting portion 11b of the cylindrical portion 11.

In the flexible printed circuit 70, a signal wiring layer 71 for transmitting a high frequency signal, and a power supply wiring layer 72 to which various power supplies, in this example, a DC power supply is supplied, the power supply wiring layer 72 being disposed in parallel with the signal wiring layer 71 at an interval are formed on a first main surface 70a by vapor deposition or the like while each extending from a first end to a second end of the first main surface 70a, and a ground layer 73 is formed on the entire region of a second main surface 70b by vapor deposition or the like. In the first embodiment, the signal wiring layer 71 is used for a semiconductor laser for optical communication, and therefore is a high frequency line having a characteristic impedance of 50Ω. Note that the signal wiring layer 71 and the power supply wiring layer 72 may be each constituted by a transmission line made of a linear conductor foil. In addition, the ground layer 73 functions as ground wiring.

As for the flexible printed circuit 70, in addition to a general polyimide, a material having a small loss of a high frequency signal, such as a liquid crystal polymer or Teflon (registered trademark) is used. In addition, the flexible printed circuit 70 has a thickness of 50 um from a viewpoint of flexibility, that is, a viewpoint that the flexible printed circuit 70 is hard and has a poor mountability when the flexible printed circuit 70 is thick, and from a viewpoint of ease of impedance design, that is, a viewpoint that when the flexible printed circuit 70 is too thin, the width of the signal wiring layer 71 for obtaining a characteristic impedance of 50Ω is strongly affected by manufacturing tolerance.

The signal wiring layer 71 is electrically connected to the signal wiring layer 41 of the ceramic substrate 40 with a metal wire 63 made of gold by wire bonding. The signal wiring layer 71 is mounted to a position of the first main surface 70a in such a manner that the length of the metal wire 63 is minimized in an allowable range on the basis of the signal wiring layer 41 of the ceramic substrate 40.

Note that when the signal wiring layer 71 of the flexible printed circuit 70 and the signal wiring layer 41 of the ceramic substrate 40 are arranged so as to face each other due to an overlap between the flexible printed circuit 70 and the ceramic substrate 40, instead of performing electrical connection with the metal wire 63, a through hole may be formed in the flexible printed circuit 70, a land electrically connected to the through hole may be formed on the second main surface 70b, and electrical connection may be performed by bringing the land into contact with the signal wiring layer 41 of the ceramic substrate 40. In this case, the signal wiring layer 41 of the ceramic substrate 40 illustrated in FIG. 3 is preferably extended to immediately below the signal wiring layer 71 of the flexible printed circuit 70.

The power supply wiring layer 72 is electrically connected to the power supply terminal 52 of the light emitting element 50a with a metal wire 64 made of gold by wire bonding. The power supply wiring layer 72 is mounted to a position of the first main surface 70a in such a manner that the length of the metal wire 64 is minimized in an allowable range on the basis of the power supply terminal 52 of the light emitting element 50a.

The ground layer 73 is formed in such a manner that a metal pattern is exposed on the second main surface 70b. The ground layer 73 is electrically and mechanically connected directly to the ground wiring layer 42 of the ceramic substrate 40 with solder, a conductive adhesive, or the like.

The flexible printed circuit 70 is mounted after the light emitting element 50a is mounted to the ceramic substrate 40. Therefore, when solder is used for connecting the ground terminal 53 of the light emitting element 50a to the ground wiring layer 42 of the ceramic substrate 40, it is necessary to mount the flexible printed circuit 70 at a temperature lower than the melting point of solder used for connecting the ground terminal 53 of the light emitting element 50a to the ground wiring layer 42 of the ceramic substrate 40. Therefore, as for the solder used for connecting the ground terminal 53 of the light emitting element 50a to the ground wiring layer 42 of the ceramic substrate 40, uSn solder having a high melting point is used, and for connecting the ground layer 73 to the ground wiring layer 42 of the ceramic substrate 40, SnAgCu solder having a lower melting point than the uSn solder or a conductive adhesive having a low curing temperature is used.

As described above, since the ground layer 73 of the flexible printed circuit 70 and the ground wiring layer 42 of the ceramic substrate 40 are directly and electrically connected to each other, favorable high frequency characteristics and connection strength can be obtained.

In the semiconductor laser module according to the first embodiment described above, an electro-absorption modulator integrated with DFB laser is used as the light emitting element 50a, and a single-phase driving (only one signal wiring layer 71 is formed on the flexible printed circuit 70 having a characteristic impedance of 50Ω) configuration in which the termination resistor 43 is disposed is adopted. In this case, a resistance value of the termination resistor 43 formed on the ceramic substrate 40 is 30Ω to 70Ω in order to obtain a filtering effect such as band compensation or low driving voltage operation.

In addition, the signal wiring layer 41 formed on the ceramic substrate 40 and the signal wiring layer 71 formed on the flexible printed circuit 70 may be each differential pair wiring of 100Ω, and an electro-absorption modulator integrated with DFB laser (EML) or a Mach-Zehnder modulator that operates by a differential may be used.

Furthermore, the signal wiring layer 41 formed on the ceramic substrate 40 and the signal wiring layer 71 formed on the flexible printed circuit 70 may be each differential pair wiring of 50Ω, and a modulated laser that does not require a termination resistor may be used.

Next, a method for manufacturing the semiconductor laser module configured as described above will be described.

Step 1

The metal stem 10 including the cylindrical portion 11 in which the FPC inserting portion 11b is formed and the base 12 standing upright from the one plane 11a of the cylindrical portion 11, and the tubular lens cap 20 with one open end in which the lens 30 is mounted on the bottomed portion 21 are prepared.

Furthermore, the ceramic substrate 40 in which the signal wiring layer 41 and the ground wiring layer 42 are formed on the first main surface 40a, the light emitting element 50a which is an electro-absorption modulator integrated with DFB laser including a distributed feedback Bragg-reflector laser and an electro-absorption modulator is mounted, and necessary circuit wiring has been performed is prepared. Mounting of the light emitting element 50a on the ceramic substrate 40 is performed, by bonding and fixing the ground terminal 53 of the light emitting element 50a to the ground wiring layer 42 of the ceramic substrate 40 with solder or the like, and electrically and mechanically connecting the ground terminal 53 to the ground wiring layer 42.

In addition, the flexible printed circuit 70 in which the signal wiring layer 71 and the power supply wiring layer 72 are formed on the first main surface 70a and the ground layer 73 is formed on the entire region of the second main surface 70b is prepared.

Step 2

The ceramic substrate 40 on which the light emitting element 50a is mounted is mounted on the one plane 12a of the base 12 of the metal stem 10. In this mounting, the second main surface of the ceramic substrate 40 is bonded and fixed to the one plane 12a of the base 12 by a generally known method.

Meanwhile, the flexible printed circuit 70 is disposed in such a manner that a first end thereof passes through the FPC inserting portion 11b of the cylindrical portion 11 of the metal stem 10 and faces the one plane 12a of the base 12 of the metal stem 10, a part of the first end of the flexible printed circuit overlaps with a part of the ceramic substrate, and a second end of the flexible printed circuit is located outside the cylindrical portion 11.

At the time of this disposition, the ground layer 73 formed on the second main surface 70b of the flexible printed circuit 70 and the ground wiring layer 42 formed on the first main surface 40a of the ceramic substrate 40 are bonded and fixed to each other with solder or the like, and are electrically and mechanically connected to each other.

In addition, the flexible printed circuit 70 is sealed with the sealing material 80 in the FPC inserting portion 11b of the cylindrical portion 11.

Since the sealing with the sealing material 80 is performed before the lens cap 20 is installed in the cylindrical portion 11, gas generated at the time of sealing does not affect the ceramic substrate 40, the light emitting element 50a, and the like.

In such a state, by wire bonding, the signal terminal 51 of the light emitting element 50a is electrically connected to the signal wiring layer 41 of the ceramic substrate 40 with the metal wire 61, the signal terminal 51 of the light emitting element 50a is electrically connected to the resistance connection wiring layer 44 of the ceramic substrate 40 with the metal wire 62, the signal wiring layer 71 of the flexible printed circuit 70 is electrically connected to the signal wiring layer 41 of the ceramic substrate 40 with the metal wire 63, and the power supply wiring layer 72 of the flexible printed circuit 70 is electrically connected to the power supply terminal 52 of the light emitting element 50a with the metal wire 64.

Step 3

In the lens cap 20, an end surface of the side wall portion 22 of the lens cap 20, that is, the open end surface 22a is fixed in contact with a peripheral end of the one plane 11a of the cylindrical portion 11 of the metal stem 10 with solder or the like. As a result, the lens cap 20 has the base 12 of the metal stem 10 disposed in a hollow portion 20a thereof, and covers the base 12, the ceramic substrate 40 on which the light emitting element 50a is mounted, and the first end of the flexible printed circuit 70.

Next, effects of the semiconductor laser module according to the first embodiment configured as described above will be described.

First, since the metal stem 10 includes the disk-shaped cylindrical portion 11 in which the FPC inserting portion 11b is formed and the base 12 standing upright from the one plane 11a of the cylindrical portion 11, the ceramic substrate 40 of which the first main surface 40a includes the signal wiring layer 41 and the ground wiring layer 42, and on which the light emitting element 50a is mounted is mounted on the one plane 12a of the base 12 of the metal stem 10, and the flexible printed circuit 70 including the signal wiring layer 71 and the power supply wiring layer 72 formed so as to extend from the first end to the second end on the first main surface, and including the ground layer 73 on the second main surface is disposed in such a manner that the first end of the flexible printed circuit 70 passes through the FPC inserting portion 11b of the cylindrical portion 11 of the metal stem 10 and faces the one plane 12a of the base 12 of the metal stem 10, and the second end of the flexible printed circuit 70 is located outside the metal stem 10, (i) the metal stem 10 can have a simple structure including the cylindrical portion 11 and the base 12, that is, a simple structure without a flange, a step, or the like, and thus can be easily manufactured by pressing, (ii) since a high frequency signal and a power supply are directly supplied to the ceramic substrate 40 and the light emitting element 50a by the flexible printed circuit 70, impedance management is easy, and high frequency characteristics are excellent, (iii) since the light emitting element 50a is mounted on the ceramic substrate 40, a favorable product of the light emitting element 50a can be selected in a state of being mounted on the ceramic substrate 40, (iv) heat generated by the light emitting element 50a is transmitted from the base 12 of the metal stem 10 to the cylindrical portion 11 via the ceramic substrate 40, and thus can be dissipated to the outside, and (v) since light output from the light emitting element 50a is condensed or converted into parallel light by the lens 30 disposed at a position facing the cylindrical portion 11 of the metal stem 10, an end surface emission type laser can be used.

Second, since the signal wiring layer 71 of the flexible printed circuit 70 is mounted to a position of the first main surface 70a in such a manner that the length of the metal wire 63 is minimized in an allowable range on the basis of the signal wiring layer 41 of the ceramic substrate 40, and the power supply wiring layer 72 is mounted to a position of the first main surface 70a in such a manner that the length of the metal wire 64 is minimized in an allowable range on the basis of the power supply terminal 52 of the light emitting element 50a, deterioration of a high frequency signal can be suppressed.

Third, since the ground layer 73 of the flexible printed circuit 70 is electrically and mechanically connected directly to the ground wiring layer 42 of the ceramic substrate 40 with solder, a conductive adhesive, or the like, a path of a return current is extremely short, and high frequency characteristics are excellent.

Fourth, since the ceramic substrate 40 is made of aluminum nitride and the light emitting element 50a is mounted on the ceramic substrate 40, the light emitting element 50a is mounted on the ceramic substrate 40 having the same linear expansion coefficient, and therefore reliability of the light emitting element 50a is excellent.

Fifth, since the flexible printed circuit 70 is sealed with the sealing material 80 in the FPC inserting portion 11b of the cylindrical portion 11 before the lens cap 20 is installed in the cylindrical portion 11, gas generated at the time of sealing does not affect the ceramic substrate 40, the light emitting element 50a, and the like.

Second Embodiment

A semiconductor laser module which is an optical module according to a second embodiment of the present invention will be described with reference to FIGS. 4 and 5.

The semiconductor laser module according to the second embodiment of the present invention is different from the semiconductor laser module according to the first embodiment of the present invention in that in the semiconductor laser module according to the first embodiment, a part of a first end of the flexible printed circuit 70 overlaps with a part of the ceramic substrate 40, and the ground layer 73 of the flexible printed circuit 70 is electrically connected in contact with the ground wiring layer 42 of the ceramic substrate 40, whereas in the semiconductor laser module according to the second embodiment, a second main surface 70b of a first end of a flexible printed circuit 70 is disposed in contact with one plane 12a of a base 12 of a metal stem 10, and a ground layer of the flexible printed circuit 70 is electrically connected to a ground wiring layer 42 of the ceramic substrate 40 with a metal wire 67 and a metal wire 68.

Figure 2:
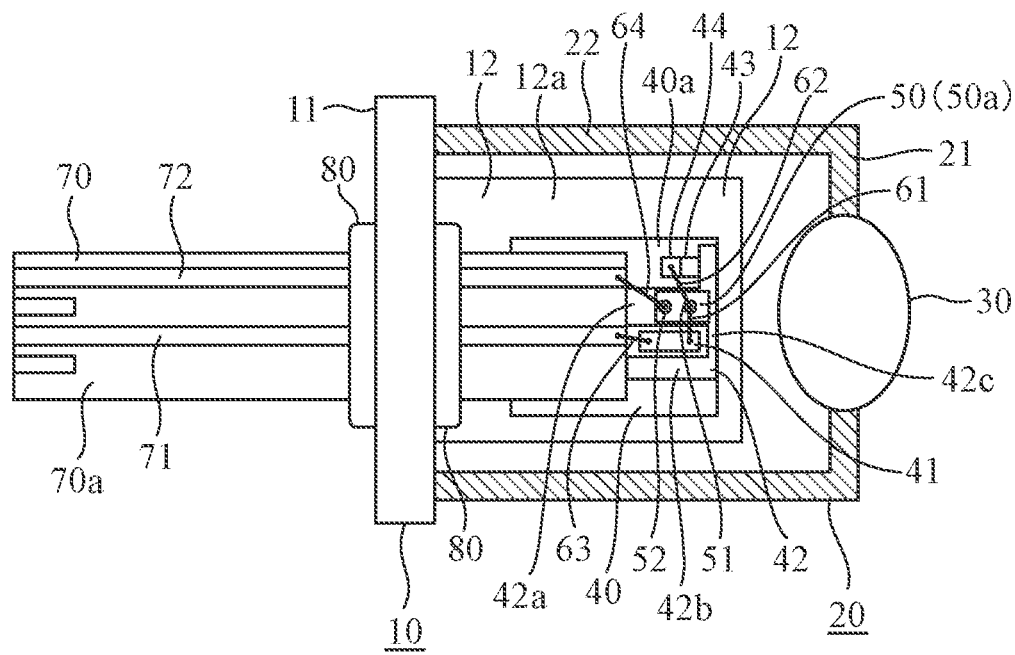
FIG. 2 is a plan view illustrating a cross section of the lens cap 20, indicating the optical module according to the first embodiment of the present invention.
Figure 4:
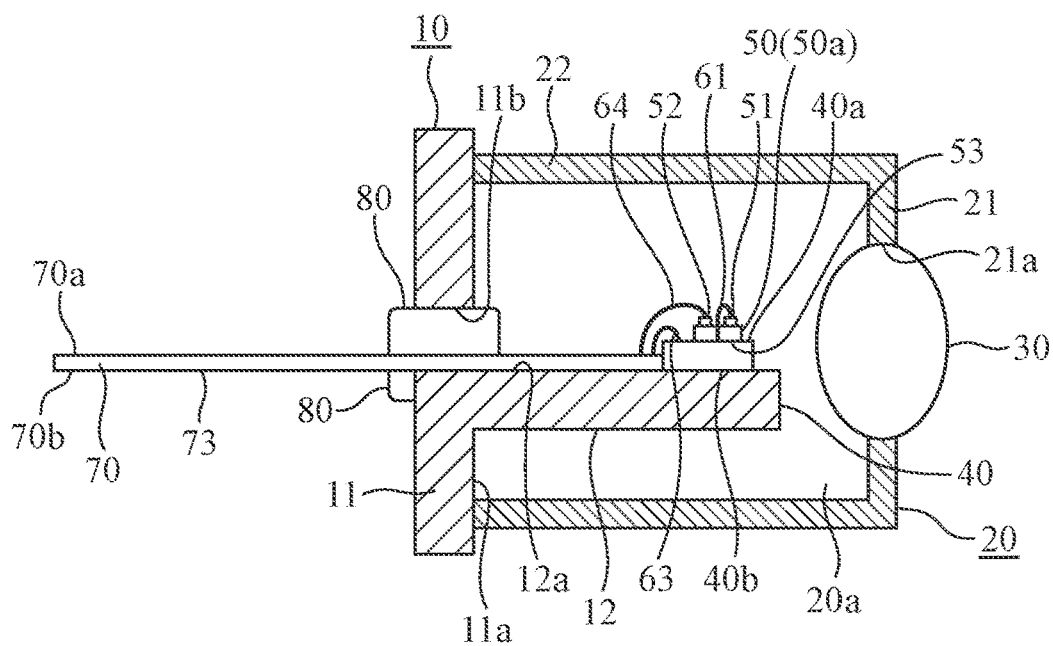
FIG. 4 is a front view illustrating a cross section of a metal stem 10 and a lens cap 20, indicating an optical module according to a second embodiment of the present invention.
Figure 5:
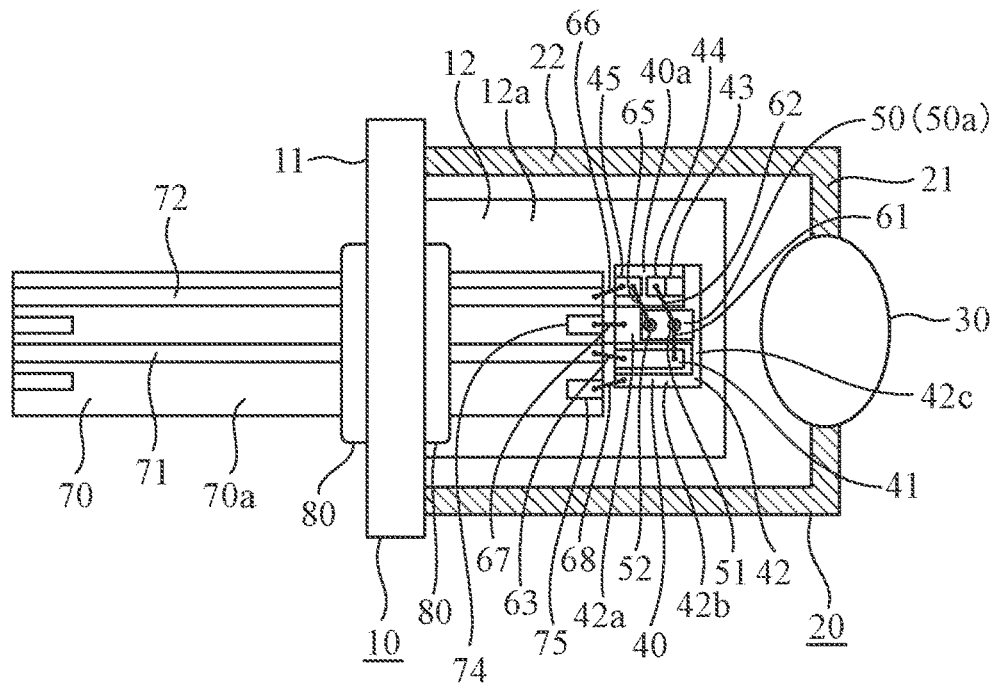
FIG. 5 is a plan view illustrating a cross section of the lens cap 20, indicating the optical module according to the second embodiment of the present invention.

Note that in FIGS. 4 and 5, the same reference numerals as those in FIGS. 1 to 3 denote the same parts as those illustrated in FIGS. 1 to 3 or corresponding parts thereto.

Therefore, points different from the first embodiment will be mainly described below.

On a first main surface 40a of the ceramic substrate 40, a signal wiring layer 41 for transmitting a high frequency signal, the ground wiring layer 42 through which a return current flows, a termination resistor 43 of 50Ω, a resistance connection wiring layer 44, and a power supply wiring layer 45 are arranged by vapor deposition or the like.

The ground wiring layer 42 has, on the first main surface 40a of the ceramic substrate 40, an end line 42c formed along an end surface on a bottomed portion 21 side (hereinafter, referred to as a first end surface), a center line 42a formed so as to extend from the center of the end line 42c to an end surface on a cylindrical portion 11 side (hereinafter, referred to as a second end surface), and a peripheral line 42b formed so as to extend along a first side face of the ceramic substrate 40 from the first end to the second end surface of the end line 42c.

The signal wiring layer 41 is formed on the first main surface 40a of the ceramic substrate 40 so as to be separated from the ground wiring layer 42, to be electrically insulated therefrom, and to extend to the second end surface of the ceramic substrate 40 between the center line 42a and the peripheral line 42b.

The power supply wiring layer 45 is formed on a second side face side of the first main surface 40a of the ceramic substrate 40 so as to be separated from the resistance connection wiring layer 44 and the center line 42a, to be electrically insulated therefrom, and to extend to the second end surface of the ceramic substrate 40.

The signal wiring layer 41 and the resistance connection wiring layer 44 of the ceramic substrate 40 are electrically connected to a signal terminal 51 of a light emitting element 50a, respectively with a metal wire 61 and a metal wire 62 by wire bonding.

The center line 42a of the ground wiring layer 42 of the ceramic substrate 40 is electrically and mechanically connected to a ground terminal 53 of the light emitting element 50a directly with solder, a conductive adhesive, or the like.

The power supply wiring layer 45 of the ceramic substrate 40 is electrically connected to a power supply terminal 52 of the light emitting element 50a with a metal wire 65.

The flexible printed circuit 70 is disposed in such a manner that a first end thereof passes through the FPC inserting portion 11b of the cylindrical portion 11 of the metal stem 10, faces the one plane 12a of the base 12 of the metal stem 10, and is in contact with the one plane 12a of the base 12, and a second end thereof is located outside the cylindrical portion 11. That is, the second main surface 70b of the flexible printed circuit 70 on a first end side is located on the same plane as the one plane 12a of the base 12, and is located on the same plane as a second main surface 40b of the ceramic substrate 40.

A lower surface of the FPC inserting portion 11b is also located on the same plane as the one plane 12a of the base 12.

The flexible printed circuit 70 is sealed with a sealing material 80 in the FPC inserting portion 11b of the cylindrical portion 11. The sealing material 80 is a glass material, and can airtightly seal a space between the flexible printed circuit 70 and the cylindrical portion 11 of the metal stem 10.

Note that, in an optical module used in a managed environment such as a data center, the flexible printed circuit 70 does not have to be sealed with the sealing material 80 in the FPC inserting portion 11b of the cylindrical portion 11.

An end surface of the flexible printed circuit 70 on the first end side and the second side face of the ceramic substrate 40 are preferably in contact with each other, and a gap therebetween is preferably equal to or less than 150 um.

Therefore, the flexible printed circuit 70 and the ceramic substrate 40 are directly mounted to the base 12 of the metal stem 10, and are bonded and fixed to the first main surface 40a of the base 12 of the metal stem 10 with solder or a conductive adhesive.

In the flexible printed circuit 70, a signal wiring layer 71 for transmitting a high frequency signal, the signal wiring layer 71 extending from the first end to the second end, and a power supply wiring layer 72 to which various power supplies, in this example, a DC power supply is supplied, the power supply wiring layer 72 being disposed in parallel with the signal wiring layer 71 at an interval are formed on a first main surface 70a, and a ground layer 73 is formed on the entire region of a second main surface 70b. In addition, in the flexible printed circuit 70, a ground pad layer 74 and a ground pad layer 75 are formed on the first main surface 70a of the first end by vapor deposition or the like, the ground pad layers being each electrically connected to the ground layer 73 via a perforated through hole (not illustrated) of which a side face is metallized. The ground layer 73, the ground pad layer 74, and the ground pad layer 75 function as ground wiring.

In the second embodiment, the signal wiring layer 71 forms a microstrip line having a characteristic impedance of 50Ω, and the microstrip line has a line width of 100 um.

As the flexible printed circuit 70, in addition to a general polyimide, a material having a small loss of a high frequency signal, such as a liquid crystal polymer or Teflon (registered trademark) is used, and the flexible printed circuit 70 has a thickness of 50 um. The thickness of the flexible printed circuit 70 only needs to be larger than 50 um, and less than a thickness, 300 um at a maximum, of the ceramic substrate 40.

The signal wiring layer 71 is electrically connected to the signal wiring layer 41 of the ceramic substrate 40 with a metal wire 63 made of gold by wire bonding. The signal wiring layer 71 is formed on the same straight line as the signal wiring layer 41 on the basis of the signal wiring layer 41 of the ceramic substrate 40. As a result, the metal wire 63 can be shortened as much as possible, and deterioration of high frequency characteristics can be prevented.

The power supply wiring layer 72 is electrically connected to the power supply wiring layer 45 of the ceramic substrate 40 with a metal wire 66 made of gold by wire bonding. The power supply wiring layer 72 is formed on the same straight line as the power supply wiring layer 45 on the basis of the power supply wiring layer 45 of the ceramic substrate 40. As a result, the metal wire 66 can be shortened as much as possible.

The ground pad layer 74 and the ground pad layer 75 are electrically connected to the center line 42a and the peripheral line 42b of the ground wiring layer 42 of the ceramic substrate 40 with the metal wire 67 and the metal wire 68 made of gold, respectively. The ground pad layer 74 and the ground pad layer 75 are formed on the same straight line as the center line 42a and the same straight line as the peripheral line 42b on the basis of the center line 42a and the peripheral line 42b of the ground wiring layer 42 of the ceramic substrate 40, respectively. As a result, the metal wire 67 and the metal wire 68 can be shortened as much as possible, and deterioration of high frequency characteristics can be prevented.

In addition, as for a formation position of a through hole connecting each of the ground pad layer 74 and the ground pad layer 75 to the ground layer 73, since a return current flows through the ground layer 73, the perforated through hole as a return current path is as close as possible to each of a connection position of the metal wire 67 in the ground pad layer 74 and a connection position of the metal wire 68 in the ground pad layer 75 in order to ensure high frequency characteristics.

By bringing the perforated through hole as close as possible to each of the connection positions, in a case where there is a possibility that solder or a conductive adhesive flows out to the first main surface 70a of the flexible printed circuit 70 via the perforated through hole and hinders connection of the metal wire 67 to the ground pad layer 74 and connection of the metal wire 68 to the ground pad layer 75 when the flexible printed circuit 70 is bonded to the base 12 of the metal stem 10 with the solder or the conductive adhesive, a filled through hole obtained by filling a through hole with a metal paste is used.

The semiconductor laser module according to the second embodiment configured as described above also exhibits the following effects.

The semiconductor laser module according to the second embodiment exhibits the following effects, in addition to the first (i) to (v), fourth, and fifth effects in the semiconductor laser module according to the first embodiment of the present invention described above.

That is, sixth, since the second main surface 70b of the flexible printed circuit 70 on the first end side and the second main surface 40b of the ceramic substrate 40 are located on the same plane as the one plane 12a of the base 12, directly mounted to the base 12 of the metal stem 10, and bonded and fixed to the first main surface 40a of the base 12 of the metal stem 10 with solder or a conductive adhesive, the size of the ceramic substrate 40 can be made smaller than the size of the ceramic substrate 40 in the semiconductor laser module according to the first embodiment.

Seventh, in addition to the gap of 0 to 150 um between an end surface of the flexible printed circuit 70 on the first end side and the second side face of the ceramic substrate 40, since the signal wiring layer 71 of the flexible printed circuit 70 is formed on the same straight line as the signal wiring layer 41 on the basis of the signal wiring layer 41 of the ceramic substrate 40, the metal wire 63 can be shortened as much as possible, and deterioration of high frequency characteristics can be prevented.

Eighth, since the ground pad layer 74 and the ground pad layer 75 of the flexible printed circuit 70 are formed on the same straight line as the center line 42a and the same straight line as the peripheral line 42b of the ground wiring layer 42 of the ceramic substrate 40 on the basis of the center line 42a and the peripheral line 42b, respectively, the metal wire 67 and the metal wire 68 can be shortened as much as possible, a path of a return current is extremely short, and high frequency characteristics are excellent.

Third Embodiment

Figure 6:
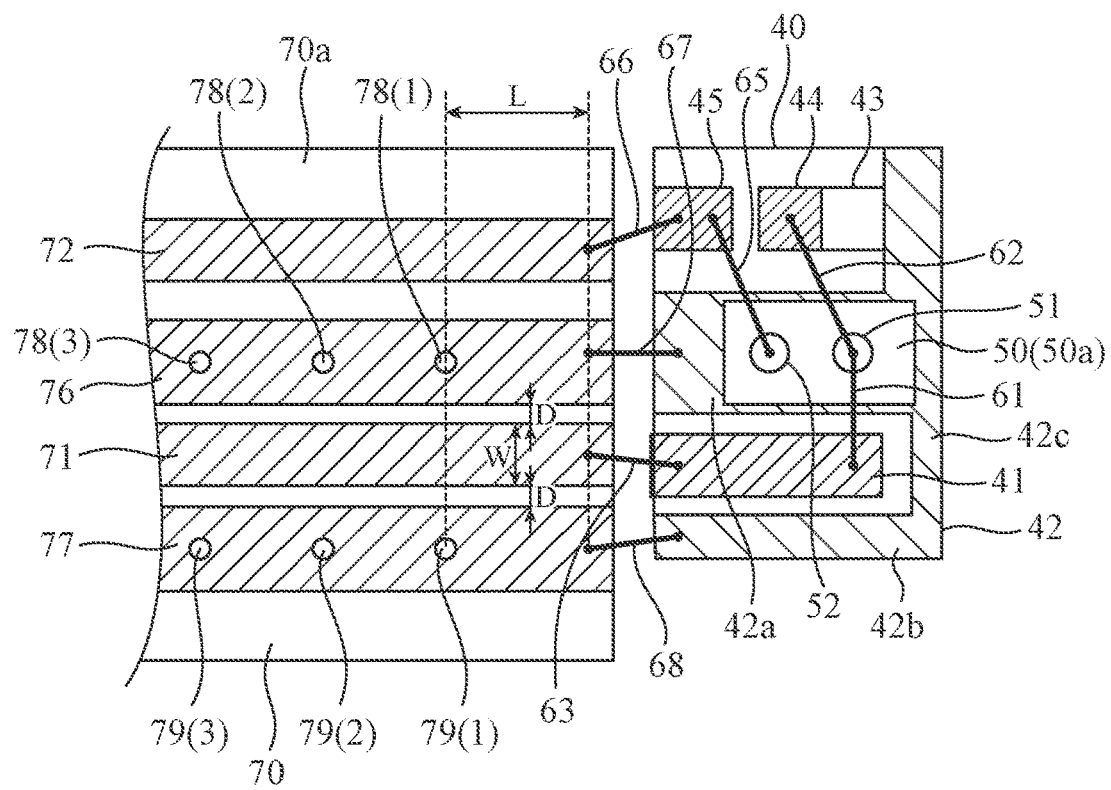
FIG. 6 is an enlarged plan view of a main part indicating a relationship between a ceramic substrate 40 and a flexible printed circuit 70 in an optical module according to a third embodiment of the present invention.

A semiconductor laser module which is an optical module according to a third embodiment of the present invention will be described with reference to FIGS. 6 and 7.

The semiconductor laser module according to the third embodiment of the present invention is different from the semiconductor laser module according to the second embodiment of the present invention only in the structure of the flexible printed circuit 70, and is the same as the semiconductor laser module according to the second embodiment in the other points.

Note that in the drawings, the same reference numerals denote the same or corresponding portions.

In a flexible printed circuit 70, a signal wiring layer 71 for transmitting a high frequency signal, the signal wiring layer 71 extending from a first end to a second end, a power supply wiring layer 72 which is disposed in parallel with the signal wiring layer 71 at an interval and to which various power supplies, in this example, a DC power supply is supplied, and a pair of ground wiring layers 76 and 77 through which a return current flows are formed in parallel on a first main surface 70a in order of the power supply wiring layer 72, the ground wiring layer 76, the signal wiring layer 71, and the ground wiring layer 77 by vapor deposition, conductor foil, or the like, and a ground layer 73 is formed on the entire region of a second main surface 70b by vapor deposition or the like.

In addition, in the flexible printed circuit 70, since there is a weak bond between the signal wiring layer 71 and the ground layer 73, in the third embodiment, the ground wiring layer 76 is electrically connected to the ground layer 73 by a plurality of perforated through holes 78(1) to 78(n) formed at equal intervals in a longitudinal direction of the ground wiring layer 76, and the ground wiring layer 77 is electrically connected to the ground layer 73 by a plurality of perforated through holes 79(1) to 79(n) formed at equal intervals in the longitudinal direction of the ground wiring layer 77.

Among the plurality of perforated through holes 78(1) to 78(n), a formation position of the perforated through hole 78(1) closest to the ceramic substrate 40 is 500 um (0.5 mm) away toward the cylindrical portion 11 from the connection position of the ground wiring layer 76 and the metal wire 67. That is, a distance L from the connection position to the formation position is 500 um (0.5 mm).

Among the plurality of perforated through holes 79(1) to 79(n), a formation position of the perforated through hole 79(1) closest to the ceramic substrate 40 is 500 um (0.5 mm) away toward the cylindrical portion 11 from the connection position of the ground wiring layer 77 and the metal wire 68. That is, a distance L from the connection position to the formation position is 500 um (0.5 mm).

Note that the distance L from the connection position to the formation position only needs to be at least 500 um. That is, when the distance L is equal to or longer than 500 um, even if solder or a conductive adhesive 90a flows out to the first main surface 70a of the flexible printed circuit 70 via the perforated through holes 78(1) to 78(n) and the perforated through holes 79(1) to 79(n) as illustrated in FIG. 7 when the flexible printed circuit 70 is bonded to the base 12 of the metal stem 10 with the solder or the conductive adhesive 90, there is no possibility that the solder or the conductive adhesive 90a hinders connection of the metal wire 67 to the ground wiring layer 76 and connection of the metal wire 68 to the ground wiring layer 77.

Figure 7:
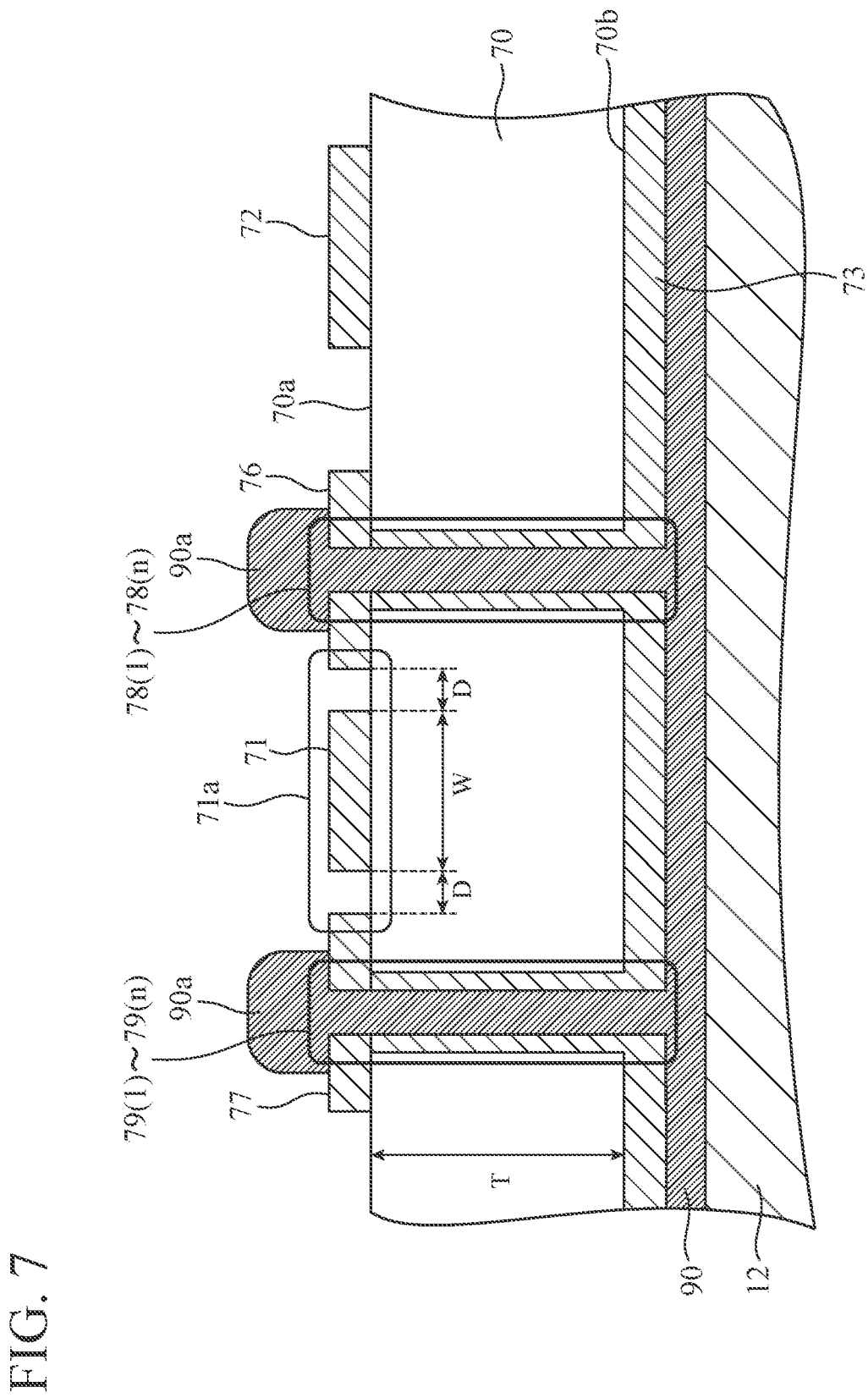
FIG. 7 is an enlarged cross-sectional view of a main part indicating a relationship between the ceramic substrate 40 and the flexible printed circuit 70 in the optical module according to the third embodiment of the present invention.

As the flexible printed circuit 70, in addition to a general polyimide, a material having a small loss of a high frequency signal, such as a liquid crystal polymer or Teflon (registered trademark) is used, and the flexible printed circuit 70 has a relative dielectric constant of 3.2 and a thickness T of 200 um (see FIG. 7). Note that the thickness T of the flexible printed circuit 70 only needs to be larger than 50 um, preferably equal to or larger than 100 um, and less than a thickness, 300 um at a maximum, of the ceramic substrate 40.

By setting the thickness T of the flexible printed circuit 70 to be larger than 50 um, preferably equal to or larger than 100 um, and less than 300 um, when the flexible printed circuit 70 is bonded to the base 12 of the metal stem 10 with solder or the conductive adhesive 90, it is possible to suppress the solder or the conductive adhesive 90a from flowing out to the first main surface 70a of the flexible printed circuit 70 via the perforated through holes 78(1) to 78(n) and the perforated through holes 79(1) to 79(n).

In addition, by increasing the thickness T of the flexible printed circuit 70, when the bond between the signal wiring layer 71 and the ground layer 73 is negligibly weak in an influence on high frequency characteristics, the perforated through holes 78(1) to 78(n) and the perforated through holes 79(1) to 79(n) do not have to be formed.

Figure 8:
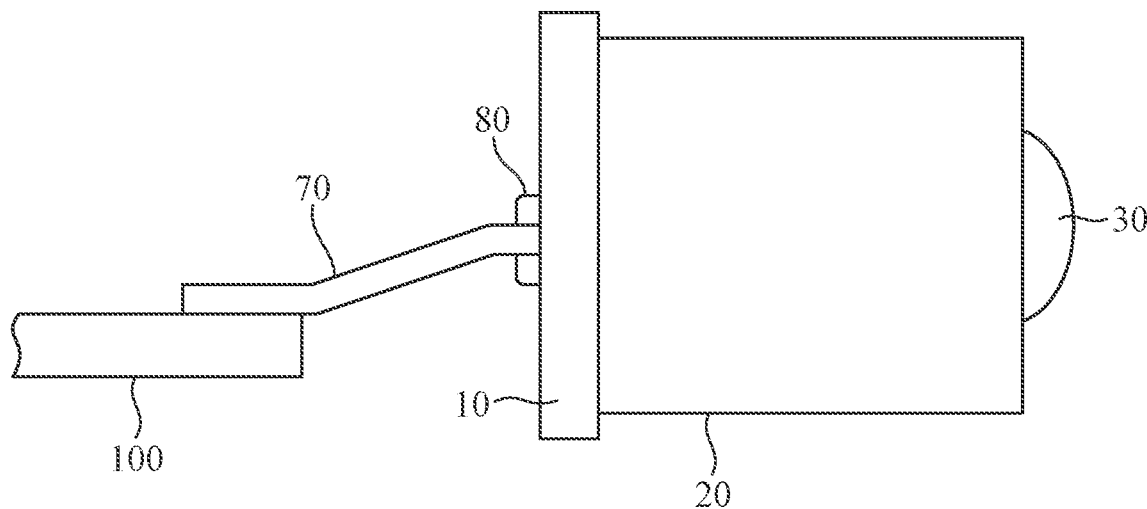
FIG. 8 is a front view illustrating an application example of the optical module according to the third embodiment of the present invention.

Furthermore, in a case where the flexible printed circuit 70 having the large thickness T is applied to an application example in which there is no need to bend the flexible printed circuit 70 largely and there is a parallel or low step positional relationship between the flexible printed circuit 70 and a printed circuit board (PCB) 100 electrically connected to a second end of the flexible printed circuit 70 as illustrated in FIG. 8, reliability of the flexible printed circuit 70 is improved.

The signal wiring layer 71 is formed between the pair of ground wiring layers 76 and 77, and therefore forms a ground-signal line-ground (GSG) type coplanar line having a characteristic impedance of 50Ω together with the pair of ground wiring layers 76 and 77. In the signal wiring layer 71, as illustrated in FIG. 7, in order to form a coplanar line, a line width W of the signal wiring layer 71 is 100 um, an interval D between the signal wiring layer 71 and the ground wiring layer 76 is 50 um, and an interval D between the signal wiring layer 71 and the ground wiring layer 77 is 50 um.

The semiconductor laser module according to the third embodiment configured as described above also exhibits the following effects.

Similarly to the semiconductor laser module according to the second embodiment described above, the semiconductor laser module according to the third embodiment exhibits the following effects, in addition to the first (i) to (v), fourth, and fifth effects in the semiconductor laser module according to the first embodiment of the present invention, and the sixth to eighth effects in the semiconductor laser module according to the second embodiment of the present invention.

That is, ninth, since the ground wiring layer 76 and the ground wiring layer 77 of the flexible printed circuit 70 are formed on the same straight line as the center line 42a and the same straight line as the peripheral line 42b of the ground wiring layer 42 of the ceramic substrate 40 on the basis of the center line 42a and the peripheral line 42b, respectively, the metal wire 67 and the metal wire 68 can be shortened as much as possible, a path of a return current is extremely short, and high frequency characteristics are excellent.

Tenth, in the flexible printed circuit 70 in which a ground-signal line-ground (GSG) type coplanar line having a characteristic impedance of 50Ω is formed by the signal wiring layer 71 and the pair of ground wiring layers 76 and 77, by setting the thickness T of the flexible printed circuit 70 to be larger than 50 um, preferably equal to or larger than 100 um and less than 300 um (less than the thickness of the ceramic substrate 40), when the flexible printed circuit 70 is bonded to the base 12 of the metal stem 10 with solder or the conductive adhesive 90, it is possible to suppress the solder or the conductive adhesive 90a from flowing out to the first main surface 70a of the flexible printed circuit 70 via the perforated through holes 78(1) to 78(n) and the perforated through holes 79(1) to 79(n).

In addition, since the flexible printed circuit 70 having the large thickness T is used, a planar position step between the first main surface 70a of the flexible printed circuit 70 and the first main surface 40a of the ceramic substrate 40 can be reduced, the lengths of the metal wire 63, the metal wire 66, the metal wire 67, and the metal wire 68 can be shortened, and high frequency characteristics are excellent.

Furthermore, when the flexible printed circuit 70 having the large thickness T is applied to an application example in which there is a parallel or low step positional relationship between the flexible printed circuit 70 and the printed circuit board 100, reliability of the flexible printed circuit 70 is improved.

Eleventh, in the flexible printed circuit 70 in which a ground-signal line-ground (GSG) type coplanar line having a characteristic impedance of 50Ω is formed by the signal wiring layer 71 and the pair of ground wiring layers 76 and 77, since the ground wiring layer 76 and the ground wiring layer 77 are connected to the ground layer 73 by the perforated through holes 78(1) to 78(n) and the perforated through holes 79(1) to 79(n), an influence of the weak bond present between the signal wiring layer 71 and the ground layer 73 can be suppressed.

Furthermore, since the distance L from the connection position between the ground wiring layer 76 and the metal wire 67 to the formation position of the perforated through hole 78(1) closest to the ceramic substrate 40 is set to equal to or more than 500 um, and the distance L from the connection position between the ground wiring layer 77 and the metal wire 68 to the formation position of the perforated through hole 79(1) closest to the ceramic substrate 40 is set to equal to or more than 500 um, even if solder or the conductive adhesive 90a flows out to the first main surface 70a of the flexible printed circuit 70 via the perforated through hole 78(1) and the perforated through hole 79(1) when the flexible printed circuit 70 is bonded to the base 12 of the metal stem 10 with the solder or the conductive adhesive 90, there is no possibility that the solder or the conductive adhesive 90a hinders connection of the metal wire 67 to the ground wiring layer 76 and connection of the metal wire 68 to the ground wiring layer 77.

Fourth Embodiment

Figure 9:
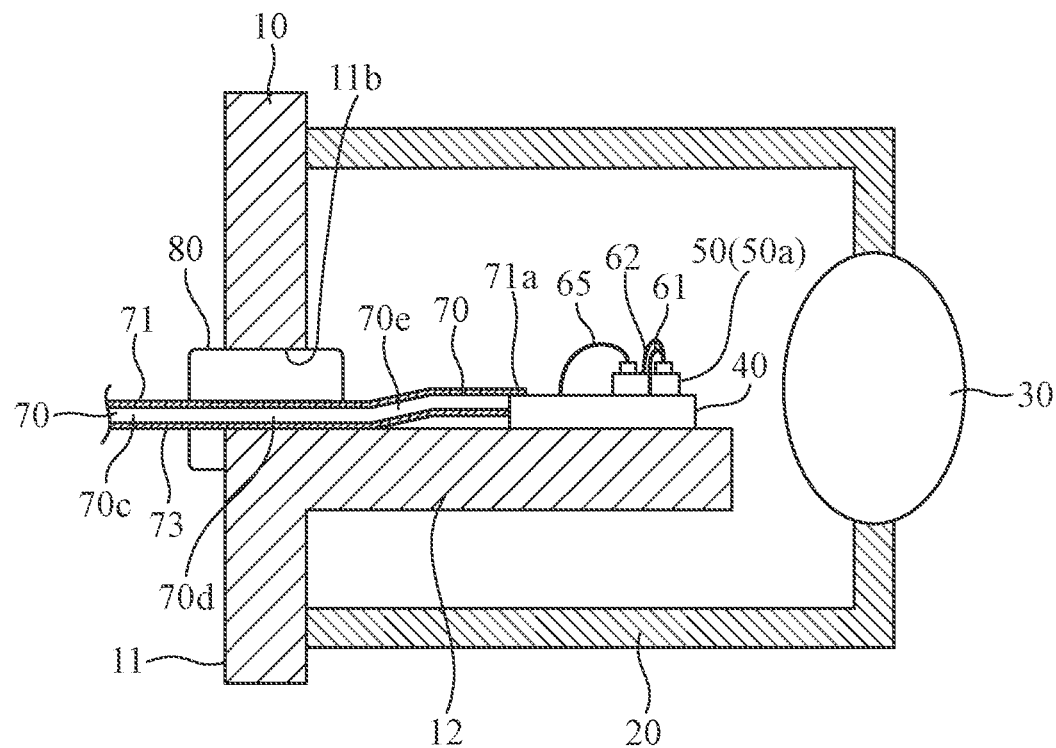
FIG. 9 is a front view illustrating a cross section of a metal stem 10 and a lens cap 20, indicating an optical module according to a fourth embodiment of the present invention.
Figure 10:
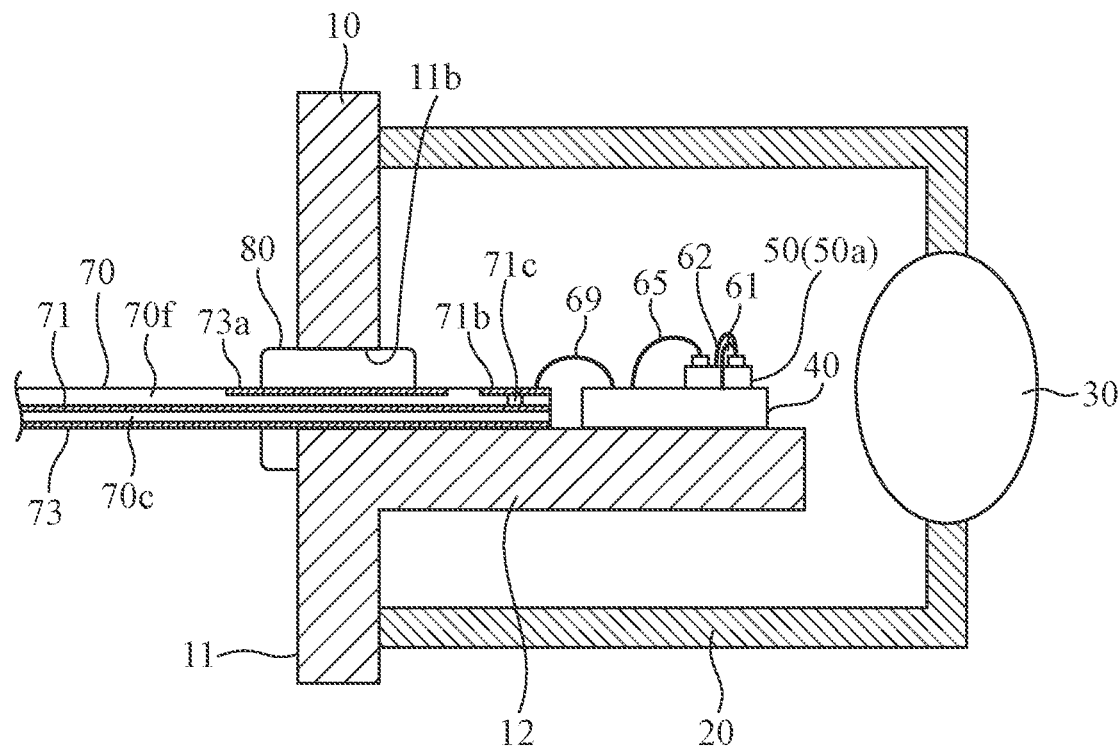
FIG. 10 is a front view illustrating a cross section of a metal stem 10 and a lens cap 20, indicating an optical module according to a fifth embodiment of the present invention.
Figure 11:
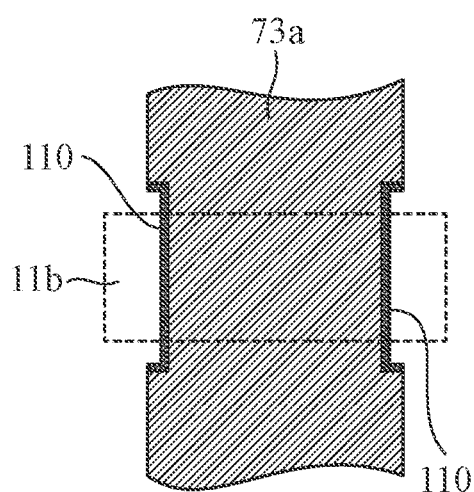
FIG. 11 is a plan view illustrating a front surface of an upper layer base material 70f located in an FPC inserting portion 11b of a cylindrical portion 11 of a metal stem 10 in the optical module according to the fifth embodiment of the present invention.
Figure 12:
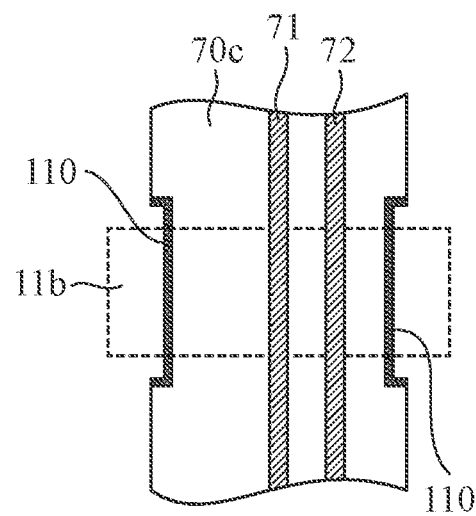
FIG. 12 is a plan view illustrating a front surface of a lower layer base material 70c located in the FPC inserting portion 11b of the cylindrical portion 11 of the metal stem 10 in the optical module according to the fifth embodiment of the present invention.
Figure 13:
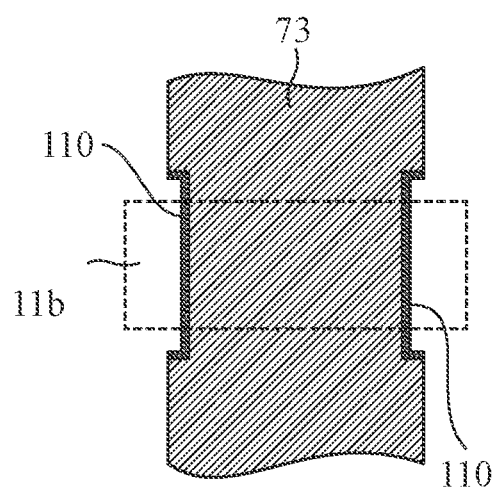
FIG. 13 is a plan view illustrating a back surface of the lower layer base material 70c located in the FPC inserting portion 11b of the cylindrical portion 11 of the metal stem 10 in the optical module according to the fifth embodiment of the present invention.

A semiconductor laser module which is an optical module according to a fourth embodiment of the present invention will be described with reference to FIG. 9.

The semiconductor laser module according to the fourth embodiment of the present invention is different from the semiconductor laser module according to the second or third embodiment of the present invention only in the structure of the flexible printed circuit 70, and is the same as the semiconductor laser module according to the second or third embodiment of the present invention in the other points.

That is, the flexible printed circuit 70 according to the fourth embodiment is obtained, by forming an electrode protruding portion 71a in which the signal wiring layer 71 protrudes from an end surface on a first end side of a base material 70c, and by directly connecting the electrode protruding portion 71a to a signal wiring layer 41 formed on a ceramic substrate 40 with solder in the flexible printed circuit 70 in the semiconductor laser module according to the second or third embodiment. This point will be mainly described below.

Note that in the drawings, the same reference numerals denote the same or corresponding portions.

The signal wiring layer 71 for transmitting a high frequency signal formed on the flexible printed circuit 70 extends from a first end to a second end of the base material 70c, and further has the electrode protruding portion 71a protruding from the first end of the base material 70c.

The end surface on the first end side of the base material 70c of the flexible printed circuit 70 is preferably in contact with a second side face of the ceramic substrate 40, and a gap therebetween is preferably equal to or less than 150 um.

The flexible printed circuit 70 has a fixing portion 70d at a first end, and a curved portion 70e curved from the fixing portion 70d to an end of the curved portion 70e.

The flexible printed circuit 70 is disposed in such a manner that the first end thereof passes through an FPC inserting portion 11b of a cylindrical portion 11 of a metal stem 10, and faces one plane 12a of a base 12 of the metal stem 10, and a second end thereof is located outside the cylindrical portion 11. The fixing portion 70d located inside the cylindrical portion 11 from the FPC inserting portion 11b of the cylindrical portion 11 is in contact with the one plane 12a of the base 12, and a second main surface 70b located at the fixing portion 70d is located on the same plane as the one plane 12a of the base 12 and is located on the same plane as a second main surface 40b of the ceramic substrate 40.

The fixing portion 70d of the flexible printed circuit 70 is in contact with the one plane 12a of the base 12, and is fixed by solder or a conductive adhesive.

The curved portion 70e of the flexible printed circuit 70 is curved in a direction away from the one plane 12a of the base 12, an end surface on the first end side of the base material 70c of the flexible printed circuit 70 faces the second side face of the ceramic substrate 40, and the electrode protruding portion 71a of the signal wiring layer 71 is in contact with the signal wiring layer 41 of the ceramic substrate 40 in a state where a force is applied in a direction of the signal wiring layer 41 due to a repulsive force that tries to return straight from the curved shape of the curved portion 70e itself.

When the repulsive force is weak, the electrode protruding portion 71a is directly and electrically connected to the signal wiring layer 41 of the ceramic substrate 40 using solder or a conductive adhesive.

Similarly to the semiconductor laser module according to the second embodiment, a return path of the flexible printed circuit 70 from the ground wiring layer 42 of the ceramic substrate 40 may have a structure in which the ground pad layer 74 and the ground pad layer 75 each electrically connected to the ground layer 73 via a perforated through hole (not illustrated) are arranged on a first main surface 70a at the first end.

Similarly to the semiconductor laser module according to the third embodiment, the return path of the flexible printed circuit 70 from the ground wiring layer 42 of the ceramic substrate 40 may have a structure in which the pair of ground wiring layers 76 and 77, which is formed on the first main surface 70a and through which a return current flows while sandwiching the signal wiring layer 71 therebetween, is disposed.

In a case where the pair of ground wiring layers 76 and 77 constituting a coplanar line together with the signal wiring layer 71 is included, similarly to the signal wiring layer 71, each of the ground wiring layer 76 and the ground wiring layer 77 extends from a first end to a second end of the base material 70c and further has an electrode protruding portion protruding from the first end of the base material 70c.

The electrode protruding portion of the ground wiring layer 76 is in contact with and electrically connected to the center line 42a of the ground wiring layer 42 of the ceramic substrate 40 in a state where a force is applied in a direction of the signal wiring layer 41 by a repulsive force of the curved portion 70e itself.

In addition, the electrode protruding portion of the ground wiring layer 77 is in contact with and electrically connected to the peripheral line 42b of the ground wiring layer 42 of the ceramic substrate 40 in a state where a force is applied in a direction of the signal wiring layer 41 by a repulsive force of the curved portion 70e itself.

Also in this case, when the repulsive force is weak, using solder or a conductive adhesive, the electrode protruding portion of the ground wiring layer 76 is directly and electrically connected to the center line 42a of the ground wiring layer 42 of the ceramic substrate 40, and the electrode protruding portion of the ground wiring layer 77 is directly and electrically connected to the peripheral line 42b of the ground wiring layer 42 of the ceramic substrate 40.

The semiconductor laser module according to the fourth embodiment configured as described above also exhibits the following effects, in addition to similar effects to those of the semiconductor laser module according to the second or third embodiment of the present invention.

That is, twelfth, since the signal wiring layer 71 of the flexible printed circuit 70 is directly and electrically connected to the signal wiring layer 41 of the ceramic substrate 40 by the electrode protruding portion 71a, deterioration of high frequency characteristics can be prevented, and higher speed signal transmission can be performed.

In addition, in a case of using the flexible printed circuit 70 including the pair of ground wiring layers 76 and 77 constituting a coplanar line together with the signal wiring layer 71, since the ground wiring layers 76 and 77 of the pair are directly and electrically connected to the center line 42a and the peripheral line 42b of the ground wiring layer 42 of the ceramic substrate 40 by the electrode protruding portions of the ground wiring layers 76 and 77, respectively, deterioration of high frequency characteristics can be prevented, and higher speed signal transmission can be performed.

Fifth Embodiment

A semiconductor laser module which is an optical module according to a fifth embodiment of the present invention will be described with reference to FIGS. 10 to 13.

The semiconductor laser module according to the fifth embodiment of the present invention is different from the semiconductor laser module according to the second embodiment of the present invention only in the structure of the flexible printed circuit 70, and is the same as the semiconductor laser module according to the second embodiment of the present invention in the other points.

That is, the flexible printed circuit 70 according to the fifth embodiment has a three-metal layer structure in which in the flexible printed circuit 70 in the semiconductor laser module according to the second embodiment, an upper layer base material 70f is formed on surfaces of the signal wiring layer 71 and the power supply wiring layer 72 formed on a first main surface, and a surface ground layer 73a is formed on a surface of the upper layer base material 70f. This point will be mainly described below.

Note that in the drawings, the same reference numerals denote the same or corresponding portions.

In the flexible printed circuit 70, a signal wiring layer 71 for transmitting a high frequency signal, and a power supply wiring layer 72 to which various power supplies, in this example, a DC power supply is supplied, the power supply wiring layer 72 being disposed in parallel with the signal wiring layer 71 at an interval are formed on a first main surface 70a by vapor deposition or the like while each extending from a first end to a second end of the first main surface 70a, and a ground layer 73 is formed on the entire region of a second main surface 70b by vapor deposition or the like. The signal wiring layer 71 and the power supply wiring layer 72 are metal layers formed on a surface of a lower layer base material 70c, and the ground layer 73 is a metal layer formed on a back surface of the lower layer base material 70c. The ground layer 73 located in the FPC inserting portion 11b of the cylindrical portion 11 of the metal stem 10 is not covered with an insulator or the like and is exposed.

In the flexible printed circuit 70, the upper layer base material 70f is formed on a surface of the lower layer base material 70c.

As both the lower layer base material 70c and the upper layer base material 70f, in addition to a polyimide, a material having a small loss of a high frequency signal, such as a liquid crystal polymer or Teflon (registered trademark) is used.

In the flexible printed circuit 70, the surface ground layer 73a is formed over the entire region in a width direction on a surface of the upper layer base material 70f located in the FPC inserting portion 11b of the cylindrical portion 11 of the metal stem 10. The surface ground layer 73a is a metal layer formed on a surface of the upper layer base material 70f, is not covered with an insulator or the like, and is exposed.

In the flexible printed circuit 70, both side faces of the flexible printed circuit 70 located in the FPC inserting portion 11b of the cylindrical portion 11 of the metal stem 10, that is, both side faces of the lower layer base material 70c and the upper layer base material 70f are processed into recessed shapes, and metallized on side faces of the recessed shapes, thereby forming a castellation 110 electrically connecting the ground layer 73 to the surface ground layer 73a. The castellation 110 is not covered with an insulator or the like and is exposed.

The flexible printed circuit 70 is disposed in such a manner that a first end thereof passes through the FPC inserting portion 11b of the cylindrical portion 11 of the metal stem 10, faces the one plane 12a of the base 12 of the metal stem 10, and is in contact with the one plane 12a of the base 12, and a second end thereof is located outside the cylindrical portion 11.

The flexible printed circuit 70 is directly mounted to the base 12 of the metal stem 10, and is bonded and fixed to the one plane 12a of the base 12 of the metal stem 10 with solder or a conductive adhesive.

The flexible printed circuit 70 is sealed with a sealing material 80 in the FPC inserting portion 11b of the cylindrical portion 11.

The sealing material 80 is solder, and can airtightly seal a space between the flexible printed circuit 70 and the cylindrical portion 11 of the metal stem 10.

The ground layer 73, the surface ground layer 73a, and the castellation 110 of the flexible printed circuit 70 are electrically connected to the cylindrical portion 11 of the metal stem 10 with the sealing material 80 which is solder.

In a portion of the flexible printed circuit 70 located in the FPC inserting portion 11b of the cylindrical portion 11 of the metal stem 10, a periphery of the flexible printed circuit 70 is surrounded by metal with the ground layer 73, the surface ground layer 73a, and the castellation 110, and the flexible printed circuit 70 is grounded. As a result, the signal wiring layer 71 located in the FPC inserting portion 11b is completely insulated from the outside and is not affected by the sealing material 80, and a stable impedance of the signal wiring layer 71 can be obtained.

In addition, since solder is used as the sealing material 80, transmission of water molecules, which causes a problem in the sealing material 80, can be avoided, and reliability of the light emitting element 50a which is a semiconductor laser is improved.

Note that the signal wiring layer 71 of the flexible printed circuit 70 is electrically connected to a signal wiring pad 71b formed on a surface of the upper layer base material 70f via a perforated through hole 71c. The signal wiring pad 71b is electrically connected to the signal wiring layer 41 of the ceramic substrate 40 with a metal wire 69.

Similarly, although not illustrated, the power supply layer 72 of the flexible printed circuit 70 is also electrically connected to a power supply wiring layer pad formed on a surface of the upper layer base material 70f via a perforated through hole. The power supply wiring pad is electrically connected to the power supply wiring layer 45 of the ceramic substrate 40 with a metal wire.

The semiconductor laser module according to the third embodiment configured as described above also exhibits the following effects.

Similarly to the semiconductor laser module according to the second embodiment described above, the semiconductor laser module according to the fifth embodiment exhibits the following effects, in addition to the first (i) to (v), fourth, and fifth effects in the semiconductor laser module according to the first embodiment of the present invention, and the sixth effect in the semiconductor laser module according to the second embodiment of the present invention.

That is, thirteenth, in a portion located in the FPC inserting portion 11b of the cylindrical portion 11 of the metal stem 10, since a periphery of the flexible printed circuit 70 is completely surrounded by metal with the ground layer 73, the surface ground layer 73a, and the castellation 110, and solder is used as the sealing material 80, airtightness in the FPC inserting portion 11b is improved, reliability of the light emitting element 50a is improved, and a stable impedance of the signal wiring layer 71 can be obtained.

Note that as for the semiconductor laser module according to the fifth embodiment of the present invention, the semiconductor laser module obtained by applying the flexible printed circuit 70 having a three-metal layer structure to the semiconductor laser module according to the second embodiment has been described. However, a semiconductor laser module obtained by applying the flexible printed circuit 70 having a three-metal layer structure to the semiconductor laser module according to the first, third, or fourth embodiment may be used.

Sixth Embodiment

Figure 14:
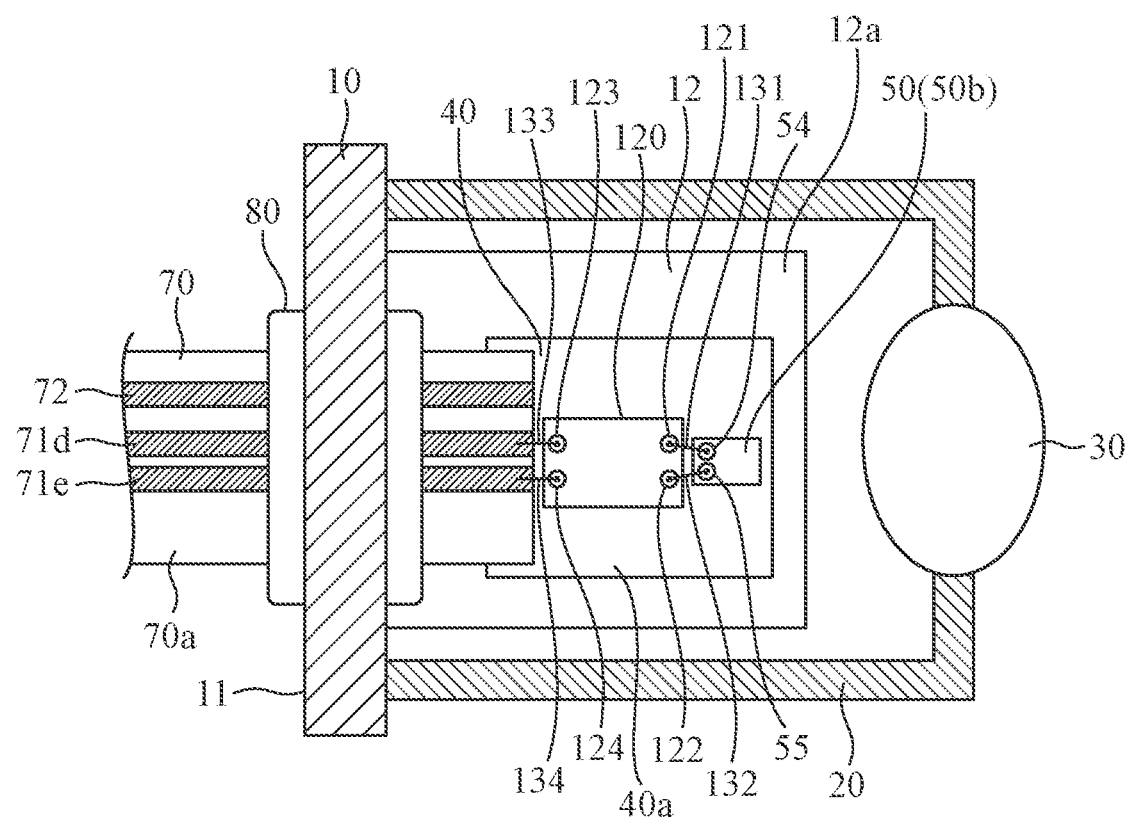
FIG. 14 is a front view illustrating a cross section of a metal stem 10 and a lens cap 20, indicating an optical module according to a sixth embodiment of the present invention.

An optical reception module on which a photodiode for optical communication which is a light receiving element which is the optical module according to a sixth embodiment of the present invention is mounted will be described with reference to FIG. 14.

Each of the optical modules according to the first to fifth embodiments of the present invention uses the semiconductor laser which is a light emitting element as the optical semiconductor element 50, but the optical module according to the sixth embodiment of the present invention uses an end surface light-receiving type photodiode (PD) which is a light receiving element, specifically, a waveguide type photodiode as the optical semiconductor element 50, and the optical module according to the sixth embodiment is the same as each of the optical modules according to the first to fifth embodiments in the other points.

Hereinafter, an example in which a waveguide type photodiode is used as the optical semiconductor element 50 in the optical module according to the first embodiment of the present invention will be described.

Note that in the drawings, the same reference numerals denote the same or corresponding portions.

In addition, an example in which a waveguide type photodiode is used as the optical semiconductor element 50 in each of the optical modules according to the second to fifth embodiments of the present invention is also similar to an example in which a waveguide type photodiode is used as the optical semiconductor element 50 in the optical module according to the first embodiment of the present invention.

The optical semiconductor element 50 (hereinafter, referred to as a light receiving element 50b) is a waveguide type photodiode disclosed in prior art "M. Nakaji, et al, Highly reliable wave-guide photodiode with wide bandwidth of 50 GHz at the low operation voltage of −1.5V, Optical Fiber Communications Conference, 2003".

On an upper surface of the light receiving element 50b, a power supply terminal 54 as an anode electrode terminal and a signal output terminal 55 as a cathode electrode terminal are formed.

The light receiving element 50b is mounted on a first main surface 40a of a ceramic substrate 40 with a light receiving surface of the light receiving element 50b facing a direction toward a lens 30, and receives light obtained by causing light from the outside to pass through the lens 30, and condensing or converting the light into parallel light.

A transimpedance amplifier (TIA) 120 which is an amplifier is mounted on the first main surface 40a of the ceramic substrate 40 closely to the light receiving element 50b.

The transimpedance amplifier 120 has, on an upper surface, a power supply terminal 121 for supplying power to the light receiving element 50b, a signal input terminal 122 for receiving an output current from the light receiving element 50b, and a differential pair of signal output terminals 123 and 124 for converting an input output current into a voltage, amplifying the voltage, and outputting the voltage.

The power supply terminal 54 of the light receiving element 50b is electrically connected to the power supply terminal 121 of the transimpedance amplifier 120 with a metal wire 131 made of gold by wire bonding.

The signal output terminal 55 of the light receiving element 50b is electrically connected to the signal input terminal 122 of the transimpedance amplifier 120 with a metal wire 132 made of gold by wire bonding.

The differential pair of signal output terminals 123 and 124 of the transimpedance amplifier 120 are formed in parallel so as to extend from a first end to a second end on a first main surface 70a of a flexible printed circuit 70, and are electrically connected by a metal wire 133 and a metal wire 134 made of gold by wire bonding so as to correspond to a differential pair of signal wiring layers 71d and 71e for transmitting an input signal, respectively.

Note that in the sixth embodiment, the transimpedance amplifier 120 is mounted on the first main surface 40a of the ceramic substrate 40, but the transimpedance amplifier 120 may be mounted on one plane 12a of a base 12 of a metal stem 10 or on the first main surface 70a of the flexible printed circuit 70 as long as the transimpedance amplifier 120 is disposed closely to the light receiving element 50b.

The optical module according to the sixth embodiment configured as described above also exhibits similar effects to the optical module according to the first embodiment of the present invention.

In addition, also in a case where a waveguide type photodiode is used as the optical semiconductor element 50 in each of the optical modules according to the second to fifth embodiments of the present invention, similar effects to the optical modules according to each of the second to fifth embodiments are exhibited.

In addition, in the optical module according to the sixth embodiment of the present invention, the light receiving element 50b and the transimpedance amplifier 120 are mounted on the first main surface 40a of the ceramic substrate 40, but the light emitting element 50a illustrated in the optical module according to each of the optical modules according to the second to fifth embodiments of the present invention may be also mounted on the first main surface 40a of the ceramic substrate 40.

That is, an optical transmission and reception module on which a semiconductor laser and a photodiode for optical communication are mounted may be used.

In the optical transmission and reception module, the light emitting element 50a, the light receiving element 50b, and the transimpedance amplifier 120 are mounted on the first main surface 40a of the ceramic substrate 40.

In this case, the signal wiring layer 71 for the light emitting element 50a, and the signal wiring layer 71d and the signal wiring layer 71e for the light receiving element 50b are formed in parallel on the first main surface 70a of the flexible printed circuit 70.

Note that the present invention can freely combine the embodiments to each other, modify any constituent element in each of the embodiments, or omit any constituent element in each of the embodiments within the scope of the invention.

INDUSTRIAL APPLICABILITY

The optical module according to the present invention can be used as an optical transmission module for optical communication as described in the first to fifth embodiments, can be used as an optical reception module for optical communication as described in the sixth embodiment, and can be used as an optical transmission and reception module on which both a light emitting element and a light receiving element are mounted.

REFERENCE SIGNS LIST

10: Metal stem, 11: Cylindrical portion, 11a: One plane, 11b: FPC inserting portion, 12: Base, 20: Lens cap, 21: Bottomed portion, 22: Side wall portion, 22a: Open end surface, 30: Lens, 40: Ceramic substrate, 40a: First main surface, 40b: Second main surface, 41: Signal wiring layer, 42: Ground wiring layer, 43: Termination resistor, 44: Resistance connection wiring layer, 50: Optical semiconductor element, 50a: Light emitting element, 50b: Light receiving element, 51: Signal terminal, 52: Power supply terminal, 53: Ground terminal, 61 to 64: Metal wire, 70: Flexible printed circuit, 70a: First main surface, 70b: Second main surface, 70c: Base material (lower layer base material), 70d: Fixing portion, 70e: Curved portion, 70f: Upper layer base material, 71: Signal wiring layer, 71a: Electrode protruding portion, 71d: Signal wiring layer, 71e: Signal wiring layer, 72: Power supply wiring layer, 73: Ground layer, 73a: Surface ground layer, 74: Ground pad layer, 75: Ground pad layer, 76: Ground wiring layer, 77: Ground wiring layer, 78(1) to 78(n): Perforated through hole, 79(1) to 79(n): Perforated through hole, 80: Sealing material, 110: Castellation

The invention claimed is:
1. An optical module comprising:
a metal stem including a cylindrical portion in which an FPC inserting portion is formed, and a base standing upright from one plane of the cylindrical portion;
a tubular lens cap with one open end, the tubular lens cap covering the base of the metal stem, having an open end surface fixed in contact with a peripheral portion of the one plane of the cylindrical portion of the metal stem, and having a lens mounted on a bottomed portion of the tubular lens cap;

a ceramic substrate mounted on one plane of the base of the metal stem, and including a signal wiring layer and a ground wiring layer formed on a first main surface of the ceramic substrate;

an optical semiconductor element mounted on the first main surface of the ceramic substrate, having a signal terminal electrically connected to the signal wiring layer of the ceramic substrate and a ground terminal electrically connected to the ground wiring layer of the ceramic substrate, and including a light emitting element to emit light in a direction toward the lens; and a flexible printed circuit having a first end passing through the FPC inserting portion of the cylindrical portion of the metal stem and facing the one plane of the base of the metal stem, having a second end located outside the metal stem, and including a signal wiring layer formed on a first main surface of the flexible printed circuit so as to extend from the first end to the second end and electrically connected to the signal wiring layer of the ceramic substrate with a metal wire at the first end.

2. The optical module according to claim 1, wherein
the flexible printed circuit includes a ground layer formed on a second main surface of the flexible printed circuit so as to extend from the first end to the second end, and
a part of the first end of the flexible printed circuit overlaps with a part of the ceramic substrate, and the ground layer of the flexible printed circuit is electrically connected in contact with the ground wiring layer of the ceramic substrate.

3. The optical module according to claim 1, wherein
the flexible printed circuit includes a ground layer formed on a second main surface of the flexible printed circuit so as to extend from the first end to the second end, and
the second main surface of the flexible printed circuit at the first end is disposed in contact with the one plane of the base, and an end surface of the flexible printed circuit on the first end side is disposed so as to face a side face of the ceramic substrate.

4. The optical module according to claim 3, wherein
the flexible printed circuit includes a ground pad electrically connected to the ground layer formed on the second main surface via a perforated through hole, and
the ground pad of the flexible printed circuit is electrically connected to the ground wiring layer of the ceramic substrate with a metal wire.

5. The optical module according to claim 1, wherein
the flexible printed circuit includes, on the first main surface of the flexible printed circuit, a pair of ground wiring layers sandwiching the signal wiring layer therebetween, formed so as to extend from the first end to the second end, and constituting a coplanar line together with the signal wiring layer,
a second main surface of the flexible printed circuit at the first end is disposed in contact with the one plane of the base, and an end surface of the flexible printed circuit on the first end side is disposed so as to face a side face of the ceramic substrate, and
each of the pair of ground wiring layers of the flexible printed circuit is electrically connected to the ground wiring layer of the ceramic substrate with a metal wire.

6. The optical module according to claim 5, wherein
the flexible printed circuit includes, on the second main surface, a ground layer formed so as to extend from the first end to the second end, and electrically connected to each of the pair of ground wiring layers formed on the first main surface via a plurality of perforated through holes, and a distance from a connection position between one of the ground wiring layers and the corresponding metal wire to a formation position of a closest one of the corresponding plurality of perforated through holes to the ceramic substrate is equal to or more than 500 um, and a distance from a connection position between the other of the ground wiring layers and the corresponding metal wire to a formation position of a closest one of the corresponding plurality of perforated through holes to the ceramic substrate is equal to or more than 500 um.

7. The optical module according to claim 5, wherein the flexible printed circuit has a thickness of more than 50 um and smaller than that of the ceramic substrate.

8. An optical module comprising:
a metal stem including a cylindrical portion in which an FPC inserting portion is formed, and a base standing upright from one plane of the cylindrical portion;
a tubular lens cap with one open end, the tubular lens cap covering the base of the metal stem, having an open end surface fixed in contact with a peripheral portion of the one plane of the cylindrical portion of the metal stem, and having a lens mounted on a bottomed portion of the tubular lens cap;
a ceramic substrate mounted on one plane of the base of the metal stem, and including a signal wiring layer and a ground wiring layer formed on a first main surface of the ceramic substrate;
an optical semiconductor element mounted on the first main surface of the ceramic substrate, and having a signal terminal electrically connected to the signal wiring layer of the ceramic substrate and a ground terminal electrically connected to the ground wiring layer of the ceramic substrate; and
a flexible printed circuit having a first end passing through the FPC inserting portion of the cylindrical portion of the metal stem and facing the one plane of the base of the metal stem, having a second end located outside the metal stem, and including a signal wiring layer formed on a first main surface of the flexible printed circuit so as to extend from the first end to the second end, wherein
the flexible printed circuit includes a fixing portion located inside the cylindrical portion from the FPC inserting portion and fixed in contact with the one plane of the base, and a curved portion curved in a direction away from the one plane of the base from the fixing portion to an end of the curved portion and having an end surface facing a side face of the ceramic substrate, and
the signal wiring layer of the flexible printed circuit has an electrode protruding portion protruding from the end surface of the curved portion of a base material of the flexible printed circuit, and electrically connected in contact with the signal wiring layer of the ceramic substrate.

9. The optical module according to claim 8, wherein
the flexible printed circuit includes, on the first main surface of the flexible printed circuit, a pair of ground wiring layers sandwiching the signal wiring layer therebetween, formed so as to extend from the first end to the second end, and constituting a coplanar line together with the signal wiring layer, and
each of the pair of ground wiring layers of the flexible printed circuit has an electrode protruding portion protruding from the end surface of the curved portion of the base material of the flexible printed circuit, and electrically connected in contact with the ground wiring layer of the ceramic substrate.

10. The optical module according to claim 1, wherein
the flexible printed circuit includes: an upper layer base material formed on surfaces of the signal wiring layer and a power supply wiring layer formed on the first main surface of the flexible printed circuit; a surface ground layer formed over an entire region in a width direction on a surface of the upper layer base material located in the FPC inserting portion of the cylindrical portion of the metal stem; and a castellation formed on both side faces of the flexible printed circuit located in the FPC inserting portion of the cylindrical portion of the metal stem and electrically connecting a ground layer formed on a second main surface of the flexible printed circuit and the surface ground layer to each other, and in the flexible printed circuit, the ground layer, the surface ground layer, and the castellation located in the FPC inserting portion of the cylindrical portion of the metal stem and formed on the second main surface are electrically connected to the cylindrical portion of the metal stem with a sealing material which is solder.

11. The optical module according to claim 1, wherein the light emitting element of the optical semiconductor element is an end surface emission type semiconductor laser.

12. The optical module according to claim 1, wherein the optical semiconductor element further includes a light receiving element to receive light that has passed through the lens.

13. The optical module according to claim 12, wherein the light receiving element of the optical semiconductor element is an end surface light-receiving type photodiode.

14. An optical module comprising:
a metal stem including a cylindrical portion in which an FPC inserting portion is formed, and a base standing upright from one plane of the cylindrical portion;
a tubular lens cap with one open end, the tubular lens cap covering the base of the metal stem, having an open end surface fixed in contact with a peripheral portion of the one plane of the cylindrical portion of the metal stem, and having a lens mounted on a bottomed portion of the tubular lens cap;
a ceramic substrate mounted on one plane of the base of the metal stem;
an optical semiconductor element mounted on a first main surface of the ceramic substrate, and including a light receiving element to receive light that has passed through the lens;
an amplifier mounted on the first main surface of the ceramic substrate or the one plane of the base of the metal stem, and having a signal input terminal to receive an output from the light receiving element, and a signal output terminal; and
a flexible printed circuit having a first end passing through the FPC inserting portion of the cylindrical portion of the metal stem and facing the one plane of the base of the metal stem, having a second end located outside the metal stem, and including a signal wiring layer formed on a first main surface of the flexible printed circuit so as to extend from the first end to the second end and electrically connected to the signal output terminal of the amplifier with a metal wire at the first end.

15. The optical module according to claim 14, wherein the light receiving element of the optical semiconductor element is an end surface light-receiving type photodiode, and the amplifier is a transimpedance amplifier.

16. The optical module according to claim 14, wherein
the flexible printed circuit includes a ground layer formed so as to extend from the first end to the second end on a second main surface of the flexible printed circuit, and
a part of the flexible printed circuit at the first end overlaps with a part of the ceramic substrate, and the ground layer of the flexible printed circuit is electrically connected in contact with a ground wiring layer formed on the first main surface of the ceramic substrate.

17. The optical module according to claim 14, wherein
the flexible printed circuit includes a ground layer formed so as to extend from the first end to the second end on a second main surface of the flexible printed circuit, and
the second main surface of the flexible printed circuit at the first end is disposed in contact with the one plane of the base, and an end surface of the flexible printed circuit on the first end side is disposed so as to face a side face of the ceramic substrate.

18. The optical module according to claim 17, wherein
the flexible printed circuit has a ground pad electrically connected to the ground layer formed on the second main surface via a perforated through hole, and
the ground pad of the flexible printed circuit is electrically connected to a ground wiring layer formed on the first main surface of the ceramic substrate with a metal wire.

* * * * *